(12) United States Patent
Zhang et al.

(10) Patent No.: US 10,394,651 B2
(45) Date of Patent: Aug. 27, 2019

(54) COMPUTING SYSTEM WITH CIRCULAR-SHIFT RECOVERY MECHANISM AND METHOD OF OPERATION THEREOF

(71) Applicant: CNEX LABS, Inc., San Jose, CA (US)

(72) Inventors: Xiaojie Zhang, Saratoga, CA (US); Bing Fan, San Diego, CA (US)

(73) Assignee: CNEX LABS, Inc., San Jose, CA (US)

( * ) Notice: Subject to any disclaimer, the term of this patent is extended or adjusted under 35 U.S.C. 154(b) by 0 days.

(21) Appl. No.: 15/204,485

(22) Filed: Jul. 7, 2016

(65) Prior Publication Data

US 2017/0185482 A1 Jun. 29, 2017

Related U.S. Application Data

(60) Provisional application No. 62/272,471, filed on Dec. 29, 2015.

(51) Int. Cl.
| | |
|---|---|
| *G06F 3/06* | (2006.01) |
| *G06F 11/10* | (2006.01) |
| *H03M 13/13* | (2006.01) |
| *H03M 13/15* | (2006.01) |
| *H03M 13/37* | (2006.01) |

(52) U.S. Cl.
CPC .......... *G06F 11/1076* (2013.01); *G06F 3/064* (2013.01); *G06F 3/0619* (2013.01); *G06F 3/0689* (2013.01); *H03M 13/13* (2013.01); *H03M 13/154* (2013.01); *H03M 13/3761* (2013.01)

(58) Field of Classification Search
CPC .................. G06F 11/1076; H03M 13/154
See application file for complete search history.

(56) References Cited

U.S. PATENT DOCUMENTS

| | | | | |
|---|---|---|---|---|
| 2003/0035489 A1* | 2/2003 | Gorday | .................. | H04B 1/707 375/259 |
| 2008/0065966 A1* | 3/2008 | Jiang | .................. | H03M 13/1515 714/781 |
| 2015/0347231 A1* | 12/2015 | Gopal | .................. | G06F 11/1088 714/764 |

(Continued)

OTHER PUBLICATIONS

U.S. Appl. No. 15/204,408, filed Jul. 7, 2016, Cnex Labs, Inc.

*Primary Examiner* — Thien Nguyen
(74) *Attorney, Agent, or Firm* — Perspectives Law Group, Corp.

(57) ABSTRACT

A computing system includes an array of storage devices configured to provide access to storage data and check data corresponding to a data block length; and a storage engine, coupled to the array of storage devices, configured to: detect one more erroneous data, one more erroneous check data, or a combination thereof for representing the storage data, the check data, or a combination thereof inaccessible or failing a status check process after initial storage thereof, determine a prime shift factor for representing a smallest prime number not less than a block unit-quantity, wherein the block unit-quantity is for representing a quantity of shift units within the data block length, and iteratively generate a target recovery set based on a circular-shift mechanism utilizing the prime shift factor for recovering the one more erroneous data, the one more erroneous check data, or a combination thereof.

20 Claims, 6 Drawing Sheets

(56) References Cited

U.S. PATENT DOCUMENTS

2015/0378820 A1  12/2015  Doerner
2016/0011941 A1   1/2016  He et al.
2016/0110264 A1   4/2016  Mehta et al.
2016/0132258 A1   5/2016  Joshi et al.
2016/0134703 A1   5/2016  Ori

* cited by examiner

COMPUTING SYSTEM WITH CIRCULAR-SHIFT RECOVERY MECHANISM AND METHOD OF OPERATION THEREOF

CROSS-REFERENCE TO RELATED APPLICATION(S)

This application claims the benefit of U.S. Provisional Patent Application Ser. No. 62/272,471 filed Dec. 29, 2015, and the subject matter thereof is incorporated herein by reference thereto.

This application contains subject matter related to U.S. patent application Ser. No. 15/204,408 that was concurrently filed on Jul. 7, 2017. The subject matter thereof is incorporated herein by reference thereto.

TECHNICAL FIELD

An embodiment of the present invention relates generally to a computing system, and more particularly to a system with circular-shift recovery mechanism.

BACKGROUND

Modern consumer and industrial electronics, especially devices such as graphical computing systems, televisions, projectors, cellular phones, portable digital assistants, and combination devices, are providing increasing levels of functionality to support modern life. Research and development in the existing technologies can take a myriad of different directions. As information usage increases and becomes more pervasive, existing and new systems require interoperation and information reliability. This increasing information usage can include some loss of information or data. Often only a partial loss of information or data occurs.

Thus, a need still remains for a computing system with circular-shift recovery mechanism to provide improved information or data reliability including information or data recovery. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a computing system including: an array of storage devices configured to provide access to storage data and check data corresponding to a data block length; and a storage engine, coupled to the array of storage devices, configured to: detect one more erroneous data, one more erroneous check data, or a combination thereof for representing the storage data, the check data, or a combination thereof inaccessible or failing a status check process after initial storage thereof, determine a prime shift factor for representing a smallest prime number not less than a block unit-quantity, wherein the block unit-quantity is for representing a quantity of shift units within the data block length, and iteratively generate a target recovery set based on a circular-shift mechanism utilizing the prime shift factor for recovering the one more erroneous data, the one more erroneous check data, or a combination thereof.

An embodiment of the present invention provides a method of operation of a computing system including: providing access to storage data and check data corresponding to a data block length; detecting one more erroneous data, one more erroneous check data, or a combination thereof for representing the storage data, the check data, or a combination thereof inaccessible or failing a status check process after initial storage thereof, determining a prime shift factor for representing a smallest prime number not less than a block unit-quantity, wherein the block unit-quantity is for representing a quantity of shift units within the data block length; and iteratively generating, with a storage engine, a target recovery set based on a circular-shift mechanism utilizing the prime shift factor for recovering the one more erroneous data, the one more erroneous check data, or a combination thereof.

An embodiment of the present invention provides a non-transitory computer readable medium including instructions for execution, the instructions including: providing access to storage data and check data corresponding to a data block length; detecting one more erroneous data, one more erroneous check data, or a combination thereof for representing the storage data, the check data, or a combination thereof inaccessible or failing a status check process after initial storage thereof; determining a prime shift factor for representing a smallest prime number not less than a block unit-quantity, wherein the block unit-quantity is for representing a quantity of shift units within the data block length; and iteratively generating a target recovery set based on a circular-shift mechanism utilizing the prime shift factor for recovering the one more erroneous data, the one more erroneous check data, or a combination thereof.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
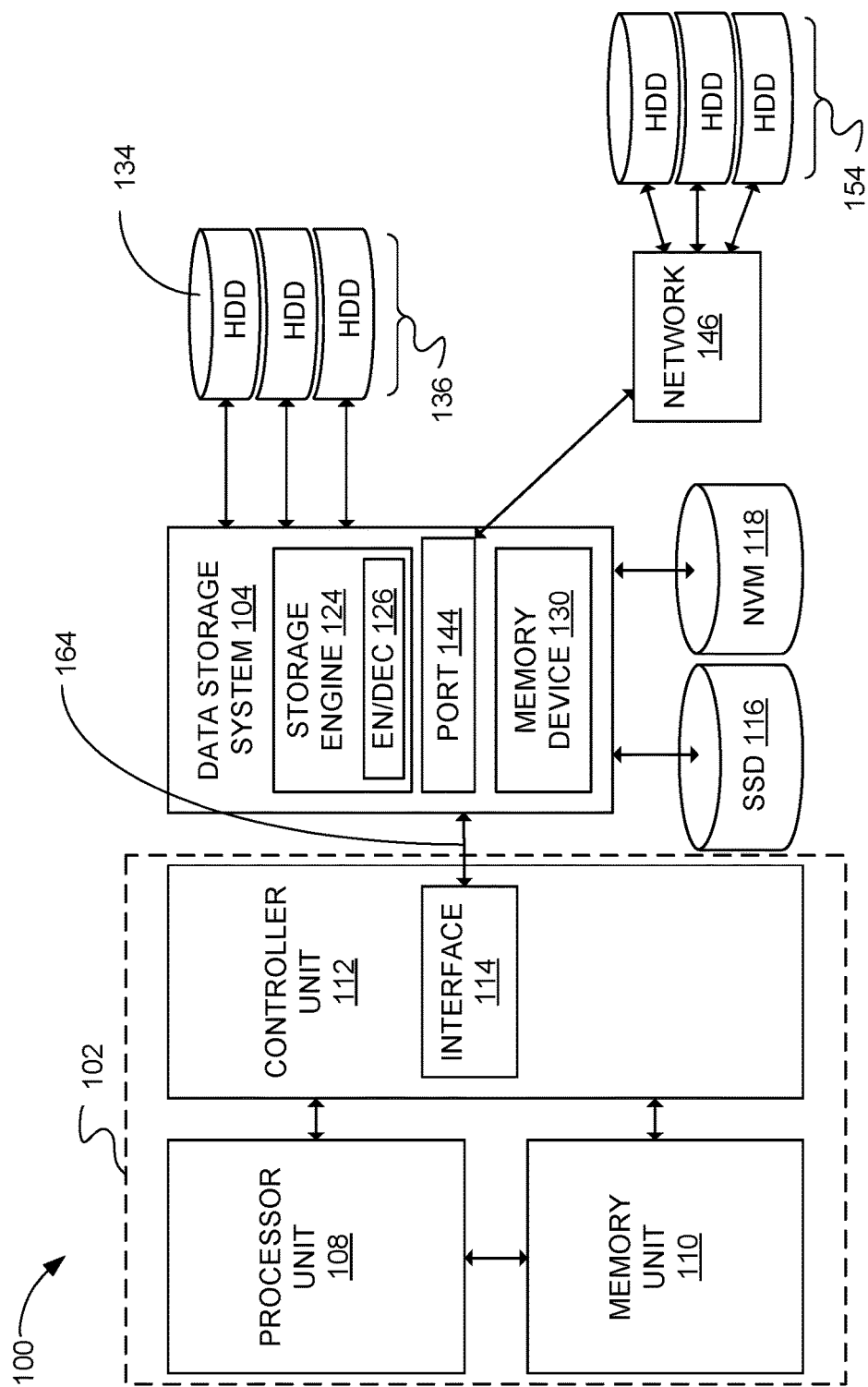
FIG. 1 is a computing system with circular-shift recovery mechanism in an embodiment of the present invention.

The following embodiments can be for encoding, decoding, and recovering computer data based on a circular-shift mechanism utilizing a prime shift factor. The circular-shift mechanism can increment shifting index, positively, negatively, or in both directions simultaneously in parallel processes, and wrapped around or barrel shifted based on the prime shift factor. The prime shift factor can represent a smallest prime number not less than a block unit-quantity for the data structure. For each iteration according to the shifting index, processing mechanism can implement various processing steps including 'exclusive OR' or AOR' function to recover corrupt data. The encoding and the decoding process can similarly be based on the prime shift factor.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or combination thereof in an embodiment of the present invention in accordance with the context in which the term is used. For example, the software can be machine code, firmware, embedded code, and application software. Also for example, the hardware can be circuitry, transistors, processor, computer, integrated circuit, integrated circuit cores, a sensor, a microelectromechanical system (MEMS), passive devices, or combination thereof. Further, if a module is written in the apparatus claims section below, the modules are deemed to include hardware circuitry for the purposes and the scope of apparatus claims. The term "unit" referred to herein can include hardware only implementations, where performance requirements preclude the use of software.

Referring now to FIG. 1, therein is shown a computing system 100 with circular-shift recovery mechanism in an embodiment of the present invention. The computing system 100 with data recovery mechanism can provide recovery of erased, erroneous, or missing information or data such as any data including parity or check information or data that is not available. The computing system 100 can be represented as a functional block diagram with the computing system 100 including a host computer 102 with a data storage system 104. The functional block diagram can include the data storage system 104 coupled to the host computer 102 such as a desk top computer, laptop computer, server, workstation, or computer cluster.

The host computer 102 can include at least a processor 108 such as a host central processing unit with one or more processors, a memory unit 110 such as a host memory coupled to the processor 108, and a controller 112 such as host bus controller. The controller 112 can provide an interface 114 such as a host interface bus, which can allow the host computer 102 to access or utilize the data storage system 104. The interface 114 can be implemented as hardware including electronic circuitry, transistors, integrated circuits, an integrated circuit core, a processor, electronic passive devices, or combination thereof. The interface 114 can also be implemented with the hardware operating software, machine code, firmware, embedded code, application software, or combination thereof.

In some embodiments, functions of the controller 112 can be provided by the processor 108. The processor 108 can be implemented with hardware circuitry in a number of different combinations or structures. For example, the processor 108 can be a processor, an application specific integrated circuit (ASIC) an embedded processor, a microprocessor, a hardware control logic, a hardware finite state machine (FSM), a digital signal processor (DSP), or combination thereof.

The data storage system 104 can include or can be coupled to a solid state disk 116, such as a non-volatile memory based storage device including a peripheral interface system, a non-volatile memory 118, such as an internal memory card for expanded or extended non-volatile system memory, or a combination thereof. The data storage system 104 can also include or can be coupled to a hard disk drive (HDD) 134 that can be mounted in the host computer 102, external to the host computer 102, or combination thereof. For example, the solid state disk 116, the non-volatile memory 118, and the hard disk drive 134 can be considered as direct attached storage (DAS) devices. An array of storage devices 136 can be formed of a plurality of the hard disk drive 134. It is understood that the array of storage devices 136 can include a plurality of the solid state disk 116, the hard disk drive 134, or a combination thereof.

The data storage system 104 can also include a network attach port 144 for coupling a network 146. For example, the network 146 can be a local area network (LAN), a storage area network (SAN), or combination thereof. The network attach port 144 can provide access to network attached storage (NAS) array 154. It is understood that the network attached storage (NAS) array 154 can include a plurality of the solid state disk 116, the hard disk drive 134, or a combination thereof. It is further understood that the network 146 can include Internet access and support a storage cloud structure.

For illustrative purposes, the network attached storage array 154 are shown as a plurality of the hard disk drive 134, although it is understood that the network attached storage array 154 can include magnetic tape storage (not shown), storage devices similar to the solid state disk 116, storage devices similar to the non-volatile memory 118, storage devices similar to the hard disk drive 134, or combination thereof, that can be accessed through the network attach port 144, the network 146, or combination thereof. The network attached storage array 154 can also include just a bunch of disks (JBOD) systems or redundant array of intelligent disks (RAID) systems, other network attached storage array 154, or combination thereof.

The data storage system 104 can be coupled to the interface 114, for providing access to multiple of the direct attached storage (DAS) devices, with a cable 164 for a storage interface, such as Serial Advanced Technology Attachment (SATA), the Serial Attached SCSI (SAS), or the Peripheral Component Interconnect-Express (PCI-e) attached storage devices. The cable 164 can couple one or more of the data storage system 104. It is understood that the data storage system 104 can be installed in a server farm that can support many of the data storage system 104 for processing large data structures. The critical nature of the data reliability can be a key aspect of the data storage system 104.

The data storage system 104 can include a storage engine 124, with an encode/decode unit 126, and a memory device 130. The storage engine 124 can be implemented with hardware circuitry, software, or combination thereof in a number of ways, combinations, or structures. For example, the storage engine 124 can be implemented as a processor, an application specific integrated circuit (ASIC) an embedded processor, a microprocessor, a hardware control logic, a hardware finite state machine (FSM), a digital signal processor (DSP), or combination thereof.

The storage engine 124 can control the flow and management of data to and from the host computer 102, from and to the direct attached storage (DAS) devices, from and to the network attached storage array 154, or combination thereof. The storage engine 124 can also perform data reliability checks and corrections. The encode/decode unit 126 can be controlled by the storage engine 124. The encode/decode unit 126 can be a hardware device configured to implement an erasure or error correction code of the storage data or communicated data, such as a forward error correction code. The encode/decode unit 126 can encode any storage data written to the solid state disk 116, the non-volatile memory 118, the array of storage devices 136, the network attached storage array 154, or the combination thereof. The encode/decode unit 126 can decode and recover any of the storage data, that uses the erasure or error correction code, read from the solid state disk 116, the non-volatile memory 118, the array of storage devices 136, the network attached storage array 154, or the combination thereof.

The storage engine 124 can also control and manage flow of data between the direct attached storage (DAS) devices, the array of storage devices 136, the network attached storage array 154, amongst any of the devices, or combination thereof. The storage engine 124 can process all of the used data through the encode/decode unit 126 for segmenting the user data and generating check data for correcting any erasure or other types of corruption that might occur.

For illustrative purposes, the storage engine 124 is shown as part of the data storage system 104, although the storage engine 124 can be implemented or partitioned differently. For example, the storage engine 124 can be implemented within the host computer 102, implemented partially with software and partially implemented in hardware, or a combination thereof. The storage engine 124 can also be external to the data storage system 104.

For example, the storage engine 124 can be part of the direct attached storage (DAS) devices described above, the network attached storage array 154, or combination thereof. The functions or functionalities of the storage engine 124 can also be distributed as part of the host computer 102, the direct attached storage (DAS) devices, the network attached storage array 154, or combination thereof.

The memory device 130 can function as a local cache to the data storage system 104, the computing system 100, or combination thereof. The memory device 130 can include a volatile memory, a nonvolatile memory, or combination thereof. For example, the volatile memory can include static random access memory (SRAM), dynamic random access memory (DRAM), or combination thereof. The memory device 130 can be used by the encode/decode unit 126 during the encoding of the storage data, decoding of the storage data, and during recovery of the storage data.

For illustrative purposes, the data storage system 104 is shown coupled to the host computer 102, although it is understood that the data storage system 104 can be implemented and partitioned differently. For example, the data storage system 104 can be implemented as a plug-in card in the host computer 102, as part of a chip or chipset in the host computer 102, as partially implemented in software and partially implemented in hardware in the host computer 102, or combination thereof. The data storage system 104 can be coupled to the host computer 102 through the network 146. For example, the data storage system 104 can be part of the direct attached storage (DAS) devices described above, the network attached storage array 154, or combination thereof. The data storage system 104 can be distributed as part of the host computer 102, the direct attached storage (DAS) devices, the network attached storage array 154, or combination thereof.

Also for illustrative purposes, the encode/decode unit 126 is shown as being included in the storage engine 124 and being associated with data storage or data access processes. However, it is understood that the encoder/decoder unit can be applicable to information communication, such as between devices, or any other processes to aid accurate recovery of intended information.

Figure 2:
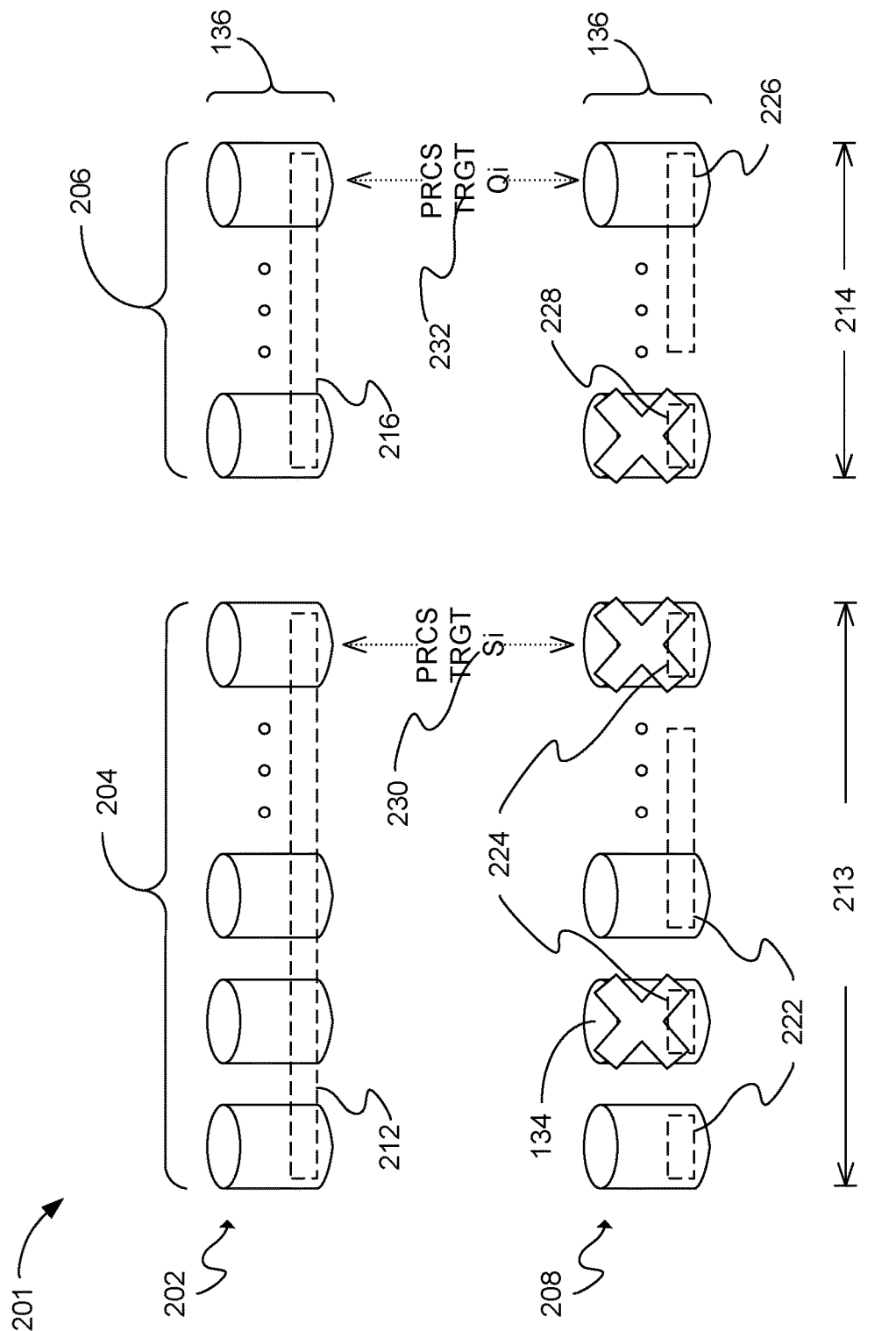
FIG. 2 is an exemplary architectural block diagram of data processing configuration for the computing system in an embodiment.

Referring now to FIG. 2, therein is shown an exemplary architectural block diagram of data processing configuration 201 for the computing system 100 in an embodiment. For example, the data processing configuration 201 can include a configuration for a data storage media as illustrated. Also for example, the data processing configuration 201 can include a configuration for a larger unit of data communication, such as a page, a block, a segment, a frame, or a combination thereof including smaller units of data therein, such as code words, symbols, bits, packets, or a combination thereof.

As a more specific example, the architectural block diagram of data processing configuration 201 can depict the solid state disk 116 of FIG. 1, the non-volatile memory 118 of FIG. 1, the array of storage devices 136, the network attached storage array 154 of FIG. 1, or the combination thereof configured to stripe a storage data 212 and a check data 216. The data processing configuration 201 can be a random array of independent disks (RAID) formed by the solid state disk 116, the non-volatile memory 118, the array of storage devices 136, the network attached storage array 154, or the combination. The data processing configuration 201 can differ from a RAID configuration by the number of volumes storing the check data 218.

The data processing configuration 201 can utilize a first data set 202 and a second data set 208. The first data set 202 and the second data set 208 can each be a grouping or a collection of information according to specific location, order, size, designation, or a combination thereof for the data processing configuration 201.

For example, the first data set 202 can correspond to a specific instance or set of the array of storage devices 136 such as a group of data disks 204 and a group of check disks 206 without erasures. Also for example, the first data set 202 can include data corresponding to a specific timing, sequence, frequency, code, or a combination thereof within a page, a block, a segment, a frame, a code word, a symbol, a set of bits, a packet, or a combination thereof.

After continued use of the data disks 204 and the check disks 206, the storage data 212 and the check data 216 can suffer increasing degrees of corruption, which can be caused by electrical, mechanical, or magnetic failures in the data processing configuration 201. The second data set 208 can be similar to the first data set 202, such as for redundant set of data or a set of data based on a different, separate, or related process. The first data set 202 and the second data set 208 can be for recovering or processing errors including erasures or missing data such as any data including parity or check data.

For example, the second data set 208 can correspond to a specific instance or set of the array of storage devices 136 such as the group of the data disks 204 and the group of the check disks 206 with erasures or missing data, such as any data including parity or check data. Also for example, the second data set 208 can include data corresponding to a specific timing, sequence, frequency, code, or a combination thereof within a page, a block, a segment, a frame, a code word, a symbol, a set of bits, a packet, or a combination thereof different from the first data set 202. As a more specific example, the first data set 202 can include payload or intended content data and the second data set 208 can include error correction data, error detection data, header information, or a combination thereof corresponding to the payload or intended content.

The first data set 202 can include the storage data 212 stored on more than one of the hard disk drives 134 of FIG. 1. As examples, the storage data 212 can include first user data, erasure or error correction code padding data, or combination thereof. Examples for the check data 216 can include first error correction information, consistency information, consistency data, check data, checksum, parity data, parity bit, or combination thereof. The storage data 212 can be a data file of considerable size and can include a plurality of data blocks or sectors of data.

The storage data 212 can correspond to a data block quantity 213. The data block quantity 213 is a measure of magnitude or number of blocks or sectors included in the storage data 212. For example, the data block quantity 213 can represent a total number of data blocks, channels, or logical unit numbers (LUNs) used for storing user data including metadata and ECC parities. The data block quantity 213 can be represented as 'N' for 'N' number of data blocks.

Each of the data blocks can further correspond to data block length 215. The data block length 215 is a quantitative representation of a size or capacity of the corresponding data block or each of the data blocks. For example, the data block length 215 can be a predetermined number of bits or bytes according to the computing system 100, one or more of the units or devices in FIG. 1, or a combination thereof.

The check data 216 can correspond to a parity block quantity 214. The parity block quantity 214 is a measure of magnitude or number of blocks or sectors included in the check data 216. For example, the parity block quantity 214 can represent a total number of parity blocks used for storing erasure coding parities. The parity block quantity 214 can be represented as 'M' for 'M' number of parity blocks.

The second data set 208 can include persistent storage-data 222, which is a readable portion of the storage data 212 that was not impacted by the erasures, the errors, or the missing data. Erroneous data 224 can refer to information or data corresponding to the data processing configuration, such as the storage data 212 or communication data, missing or unintentionally altered. The erroneous data 224 can be denoted by a symbol in a shape of an "x".

For example, the erroneous data 224 can include any portion of the storage data 212 that is unreadable, corrupted, unexpectedly changed, or a combination thereof for any reason. Also for example, the erroneous data 224 can include any portion of the page, the block, the segment, the frame, the code word, the symbol, the packet, one or more bits corresponding thereto, or a combination thereof.

The erroneous data 224 can be caused by failure of one or more of the hard disk drive 134, a sector therein, a transmission medium or communication channel, thermal or electro-mechanical influences, or a combination thereof. For example, the erroneous data 224 can be caused by degradation in signal retention capacity, degradation in voltage or power, channel fading, cross-talk or delays, influences from other interfering sources, thermal noise, or a combination thereof.

As a more specific example, the second data set 208 can include persistent check-data 226 with a portion of the check data 216 missing, such as erroneous check-data 228 denoted by a symbol in a shape of an "x". The computing system 100 with data recovery mechanism can recover lost or unrecoverable data including the erroneous data 224, the erroneous check-data 228, or combination thereof. The data recovery mechanism is described further below in subsequent figure descriptions.

For processing the data, such as for an encoding process, a decoding process, a recovery process, or a combination thereof, the computing system 100 can utilize a unit of data. For example, the computing system 100 can process a target data block 230, a target parity block 232, or a combination thereof for the encoding process, the decoding process, the recovery process, or a combination thereof.

The target data block 230 can be an instance of the data block in the storage data 212 being utilized as a subject of or an object of the encoding process, the decoding process, the recovery process, or a combination thereof. The target data block 230 can include the erroneous data 224 for the recovery process. The target data block 230 can be represented as '$S_i$'.

The target parity block 232 can be an instance of the parity block in the check data 216 being utilized as a subject of or an object of the encoding process, the decoding process, the recovery process, or a combination thereof. The target parity block 232 can include the error check data 216 or the missing portion therein for the recovery process. The target parity block 232 can be represented as '$Q_i$'.

For illustrative purposes, the array of storage devices 136 is shown having four or more of the data disks 204 with the persistent storage-data 222, the erroneous data 224, or combination thereof, although it is understood that the computing system 100 may include any number of the data disks 204. Further for illustrative purposes, the array of storage devices 136 is shown having two or more check data disks 206 with the check data 216, the erroneous check-data 228, or combination thereof, although it is understood that the computing system 100 may include any number of the data disks 204. The erroneous data 224 and the erroneous check-data 228 can each be one or more of the data blocks or sectors of data that make-up the storage data 212.

Also for illustrative purposes, the computing system 100 is described with the hard disks 134, although it is understood that the description in FIG. 2 can apply to other types of storage devices. For example, the description in FIG. 2 can be applicable to the network attached storage array 154 of FIG. 1, the direct attached storage devices as described in FIG. 1, the memory device 130 of FIG. 1, the solid state disk 116 of FIG. 1, or combination thereof.

The functions of embodiments described in this application can be implemented as instructions stored on a non-transitory computer readable medium to be executed by the host computer 102 of FIG. 1, the data storage system 104 of FIG. 1, the storage engine 124 of FIG. 1, or combination thereof. The non-transitory computer medium can include the host memory 110 of FIG. 1, the direct attached storage devices 134, the network attached storage array 154 of FIG. 1, the non-volatile memory 118 of FIG. 1, the memory devices 130 of FIG. 1, the solid state disk 116 of FIG. 1, the hard disk drive 134, or combination thereof. The non-transitory computer readable medium can include compact disk (CD), digital video disk (DVD), or universal serial bus (USB) flash memory devices. The non-transitory computer readable medium can be integrated as a part of the computing system 100 or installed as a removable portion of the computing system 100.

Figure 3:
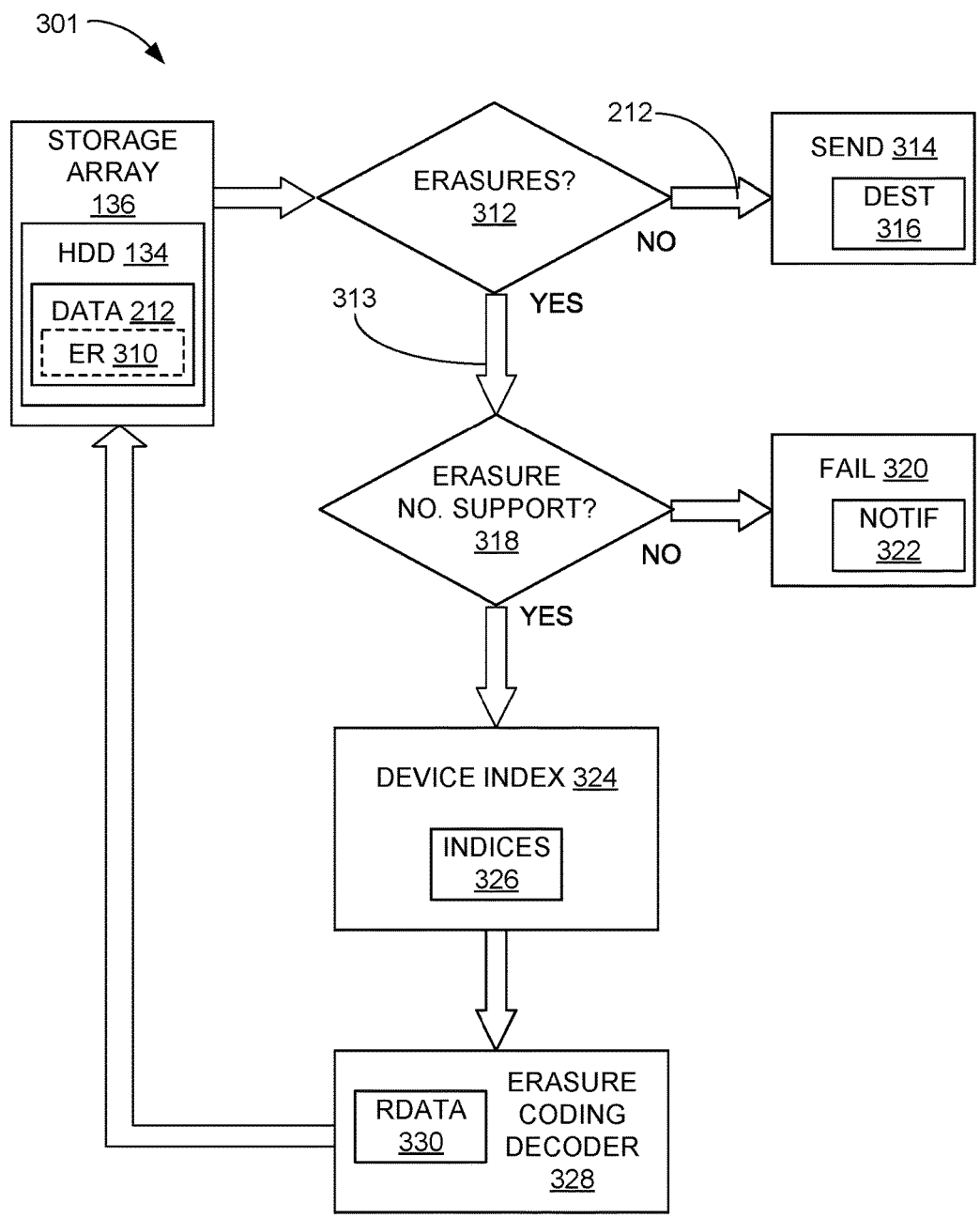
FIG. 3 is an exemplary flow diagram of data recovery process for the computing system in an embodiment.

Referring now to FIG. 3, therein is shown an exemplary flow diagram of data recovery process 301 for the computing system 100 in an embodiment. The flow diagram of data recovery process 301 depicts phases of erasure or error detection and decoding. The hard disk drive 134 of FIG. 1 can be a portion of the array of storage devices 136 of FIG. 1 in or interacting with the host computer 102 of FIG. 1. The array of storage devices 136, can include the hard disk drives 134, a group or an array of the hard disk drives 134, the storage engine 124 of FIG. 1, the memory device 130 of FIG. 1, the solid state disk 116 of FIG. 1, the controller unit 112 of FIG. 1, the network attached storage array 154 of FIG. 1, the direct attached storage devices as described in FIG. 1, or combination thereof.

The array of storage devices 136 and the hard disk drives 134 can be implemented in hardware including electronic circuitry, transistors, integrated circuits, an integrated circuit core, a processor, electronic passive devices, or combination thereof. The array of storage devices 136 and the hard disk drives 134 can also be partially implemented with the hardware operating software, machine code, firmware, embedded code, application software, or combination thereof. Further, the array of storage devices 136 and the hard disk drives 134 can be storage, memory, volatile memory, non-volatile memory, volatile storage, non-volatile storage, or combination thereof.

The array of storage devices 136 can provide the storage data 212 of FIG. 2 of the hard disk drives 134, which can include the storage data 212 of FIG. 2. The storage data 212 can be processed to determine whether the storage data 212 includes any data errors 310 including erased or missing information, ECC correctable data errors, or failed hardware data errors, such as the erroneous data 224 of FIG. 2, the erroneous check-data 228 of FIG. 2, or combination thereof.

An error check process 312 such as an erasure decision or error detection process, can determine whether any of the data errors 310 are included in the storage data 212. The error check process 312 can be implemented with hardware including electronic circuitry, transistors, integrated circuits, an integrated circuit core, a processor, electronic passive devices, or combination thereof. The error check process 312 can also be implemented with the hardware operating software, machine code, firmware, embedded code, application software, or combination thereof. The error check process 312 can further correct any of the ECC correctable data errors 310 prior to sending the storage data 212 to the next step.

The error check process 312 can determine whether the storage data 212, without the data errors 310, can be provided to a send process 314 for a destination 316. The send process 314 can transfer the storage data 212, not containing the data errors 310, to the destination 316 such as the host computer 102 of FIG. 1. The send process 314 can be implemented with hardware including electronic circuitry, transistors, integrated circuits, an integrated circuit core, a processor, electronic passive devices, or combination thereof. The send process 314 can also be implemented with the hardware operating software, machine code, firmware, embedded code, application software, or combination thereof.

The error check process 312 can transfer any error data 313, including the storage data 212 with the data errors 310, an erasure number process 318 to determine whether the error data 313 can be processed based on a number or quantity of the data errors 310 that can be supported by the encoding process of the computing system 100. The erasure number process 318 can determine the quantity, type, location, or combination thereof, of the data errors 310, which can include the erroneous data 224, the erroneous check-data 228, or combination thereof. The erasure number process 318 can be implemented with hardware including electronic circuitry, transistors, integrated circuits, an integrated circuit core, a processor, electronic passive devices, or combination thereof. The erasure number process 318 can also be implemented with the hardware operating software, machine code, firmware, embedded code, application software, or combination thereof.

The erasure number process 318 can determine whether the number of the data errors 310 exceeds the number supported by the encoding process and a failure or uncorrectable data error can be reported in a failure process 320. The failure process 320 can provide a notification 322 such as a response, report, code, or combination thereof to the host computer 102 for error recovery through other means.

The erasure number process 318 can determine that the number of erasures does not exceed the encoding process and can provide the storage data 212 to a device index process 324 to initiate the data recovery. The device index process 324 such as a recovery indices process can determine indices 326 of the data errors 310 including the erroneous data 224, the erroneous check-data 228, or combination thereof. The device index process 324 can be implemented with hardware including electronic circuitry, transistors, integrated circuits, an integrated circuit core, a processor, electronic passive devices, or combination thereof. The device index process 324 can also be implemented with the hardware operating software, machine code, firmware, embedded code, application software, or combination thereof.

The device index process 324 can provide indices 326, including the location of the erroneous data 224, the erroneous check-data 228, or combination thereof, to an erasure coding decoder 328. The erasure coding decoder 328 can receive the indices 326 to decode the data errors 310, which can include the erroneous data 224, the erroneous check-data 228, or combination thereof. The erasure coding decoder 328 can be implemented with hardware including electronic circuitry, transistors, integrated circuits, an integrated circuit core, a processor, electronic passive devices, or combination thereof. The erasure coding decoder 328 can also be implemented with the hardware operating software, machine code, firmware, embedded code, application software, or combination thereof.

The erasure coding decoder 328 can provide recovered data 330, such as regenerated data for the data errors 310, which can include the erroneous data 224, the erroneous check-data 228, or combination thereof, to the array of storage devices 136. The array of storage devices 136 can receive the recovered data 330 for one or more of the hard disk drives 134 including the full context of the storage data 212.

It has been discovered that the computing system 100 with erasure code mechanism including the data recovery process 301 can provide erasure recovery of three or more erasures. The erroneous data 224, erroneous check-data 228, or combination thereof, can be recovered by the computing system 100 with erasure code mechanism including the data recovery process 301.

Figure 4:
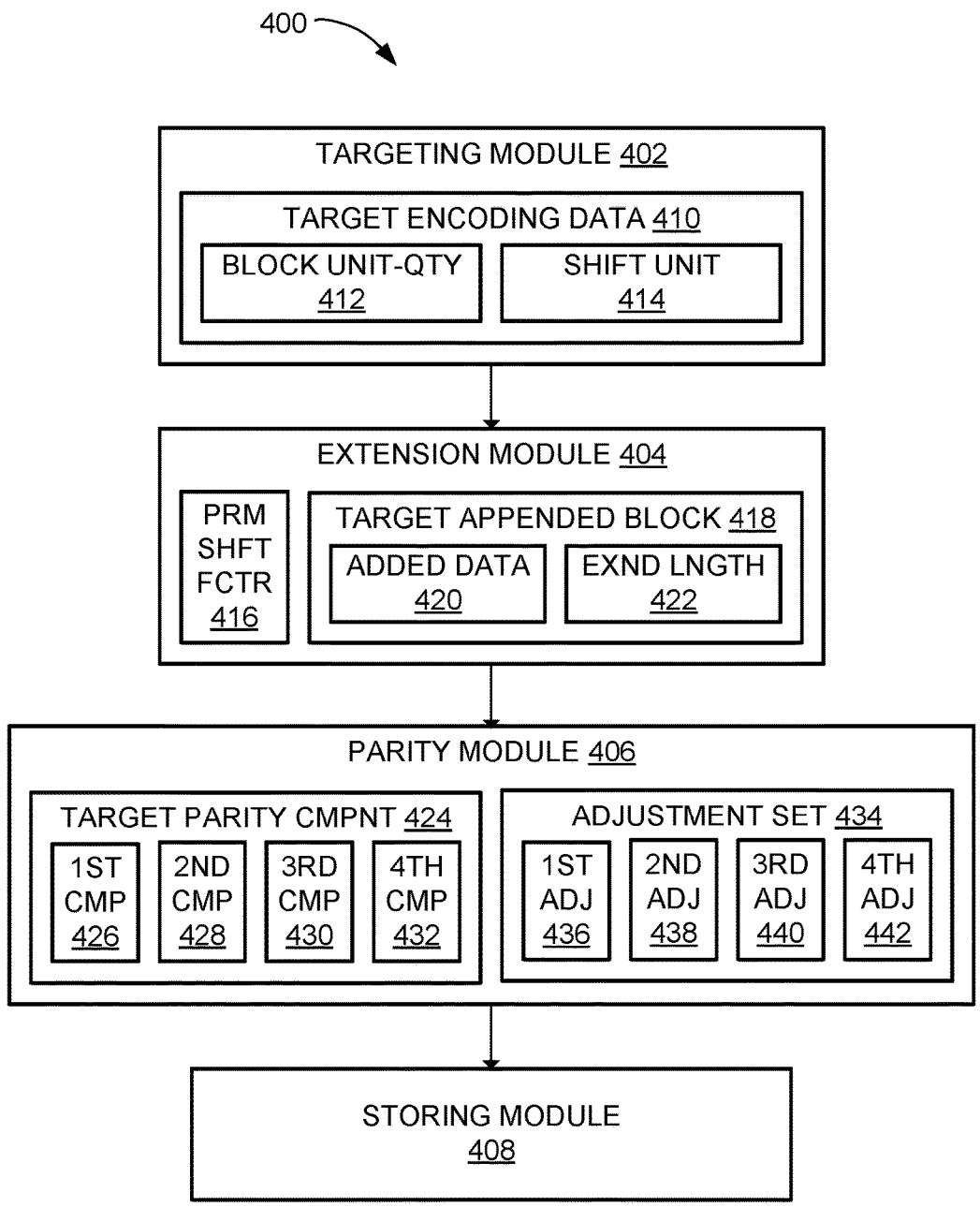
FIG. 4 is a flow diagram of an exemplary encoding process for the circular-shift recovery mechanism in an embodiment of the invention.

Referring now to FIG. 4, therein is shown a flow diagram of an exemplary encoding process 400 for the circular-shift recovery mechanism in an embodiment of the invention. The computing system 100 of FIG. 1 can utilize a targeting module 402, an extension module 404, a parity module 406, a storing module 408, or a combination thereof for the encoding process 400.

The targeting module 402 can be coupled to the extension module 404. The extension module 404 can be coupled to the parity module 406. The parity module 406 can be coupled to the storing module 408.

The modules can be coupled using wired or wireless connections, by having an output of one module as an input of the other module, by having operations of one module influence operation of the other module, or a combination thereof. The modules can be directly coupled with no intervening structures or objects other than the connector there-between, or indirectly coupled.

The targeting module 402 is configured to determine or select data for the encoding process 400. The targeting module 402 can determine target encoding data 410 as the data subject to the encoding process 400. The target encoding data 410 can be the target data block 230 of FIG. 2, the target parity block 232 of FIG. 2, or a combination thereof.

The targeting module 402 can determine the target encoding data 410 based on receiving the target encoding data 410 resulting from a different process, application, device, or a combination thereof. The targeting module 402 can further receive the target encoding data 410 generated by an end-user. For example, the target encoding data 410 can include receiving the data intended for storage as generated by or through one or more devices, applications or software, user-generated data, processing result, or a combination thereof.

The targeting module 402 can further determine the target encoding data 410 based on selecting the target encoding data 410 from a grouping or a set of information. The targeting module 402 can select the grouping or the set through an iterative process. For example, the targeting module 402 can select the target encoding data 410 as a subset, a subgrouping, or a portion of information from within a file, a database, or a combination thereof.

The targeting module 402 can determine the target encoding data 410 according to the data block length 215 of FIG. 2. The targeting module 402 can determine the target encoding data 410 having a size or a capacity of the data block length 215. The targeting module 402 can further determine the target encoding data 410 according to the data block length 215 based on shift unit 414, block unit-quantity 412, or a combination thereof.

The shift unit 414 is an arbitrary length or size for data. The shift unit 414 can be a unit predetermined by the computing system 100. For example, the shift unit 414 can be one or more bytes as predetermined by the computing system 100. The shift unit 414 can be represented as 'DU'.

The block unit-quantity 412 is a number or a quantity of the shift unit 414 within the data block length 215, the target encoding data 410, or a combination thereof. The block unit-quantity 412 can be represented as 'l'. As a specific illustrative example, the block unit-quantity 412 can be 1030 with the shift unit 414 of 1 byte.

The targeting module 402 can access the target encoding data 410, such as for receiving or selecting the target encoding data 410, using the storage engine 124 of FIG. 1, the port 144 of FIG. 1, the interface 114 of FIG. 1, or a combination thereof. The targeting module 402 can determine the target encoding data 410 using the storage engine 124, the processor unit 108 of FIG. 1, the controller unit 112 of FIG. 1, the data storage system 104 of FIG. 1, or a combination thereof.

After determining or selecting data for the encoding process 400, the control flow can pass from the targeting module 402 to the extension module 404. For example, the control flow can pass by having a processing result, such as the target encoding data 410 or a portion thereof as an output from the targeting module 402 to an input of the extension module 404.

Also for example, the control flow can further pass by storing the processing result at a location known and accessible to the extension module 404. Also for example, the control flow can further pass by notifying the extension module 404, such as by using a flag, an interrupt, a status signal, or a combination thereof. Also for example, the control flow can further pass using a combination of the processes described above.

The extension module 404 is configured to prepare the target encoding data 410. The extension module 404 can prepare by formatting or manipulating the content of the target encoding data 410. For example, the extension module 404 can prepare by determining a prime shift factor 416, generating a target appended block 418, or a combination thereof.

The prime shift factor 416 is a number utilized by the computing system 100 for encoding, decoding, recovering, or a combination thereof for the data. The prime shift factor 416 can be based on the block unit-quantity 412, the data block length 215, or a combination thereof. The prime shift factor 416 can be a prime number.

For example, the prime shift factor 416 can be a smallest prime number that is not less than the block unit-quantity 412. Continuing with the illustrative example above, when the block unit-quantity 412 is '1030', the prime shift factor 416 can be '1031', such as with one instance of the shift unit 414 greater than the block unit-quantity 412 since '1031' is the smallest prime number greater than '1030'. The barrel shift length can also be '1031' instances of the shift unit 414.

The extension module 404 can determine the prime shift factor 416 by selecting a prime number equal to or greater than the block unit-quantity 412. For example, the extension module 404 can include the prime shift factor 416 predetermined by the computing system 100. The extension module 404 can determine by accessing or utilizing the prime shift factor 416 predetermined by the computing system 100.

Also for example, the computing system 100 or the extension module 404 can be preconfigured with the selected instance of the prime shift factor 416, the data block length 215, the shift unit 414, or a combination thereof. Also for example, the extension module 404 can further determine based on dynamically accessing a table of prime numbers and selecting the number greater than and nearest to, or equal to, the block unit-quantity 412.

The target appended block 418 can be a modified instance of the target encoding data 410. The extension module 404 can generate the target appended block 418 by extending, padding, formatting, or a combination thereof based on the target encoding data 410. The extension module 404 can generate the target appended block 418 based on the prime shift factor 416.

The extension module 404 can generate the target appended block 418 based on appending or adding an added data 420 to the target encoding data 410. The added data 420 can include content predetermined by the computing system 100. For example, the added data 420 can include a set of zeros, a set of ones, or a specific combination thereof.

The added data 420 can correspond to one or more instances of the shift unit 414. Continuing with the illustrative example, the added data 420 can correspond to a set of zeros with a size or length of one or multiple bytes corresponding to the shift unit 414. The corresponding instance of the target appended block 418 can be represented as 'Di ≜ [Si, 0]'. The term 'Si' can represent the target encoding data 410.

The size or length of the added data 420 can be based on the prime shift factor 416, the block unit-quantity 412, or a combination thereof. For example, the size or length of the added data 420 can be based on a difference between the prime shift factor 416 and the block unit-quantity 412. Also for example, the size or length of the added data 420 can be 1 shift unit greater than the data block length 215, the block unit-quantity 412, or a combination thereof.

The extension module 404 can generate the target appended block 418 with the extended block length 422 for representing a length or a size of the target appended block 418. The extended block length 422 can be greater than the data block length 215 based on or due to the added data 420. For example, the extended block length 422 can be equivalent to the prime shift factor 416 or 1 shift unit greater the data block length 215, the block unit-quantity 412, or a combination thereof as discussed above.

The extension module 404 can prepare the target encoding data 410 using the storage engine 124, the processor unit 108, the controller unit 112, the data storage system 104, or a combination thereof. The extension module 404 can store the target encoding data 410 in the processor unit 108, the memory unit 110 of FIG. 1, the controller unit 112, the data storage system 104, or a combination thereof. The extension module 404 can further store the target encoding data 410 in storage devices, such as the solid state disk 116 of FIG. 1, the non-volatile memory 118 of FIG. 1, the hard disk drive 134 of FIG. 1, the array 136 of FIG. 1, or a combination thereof.

After preparing the target encoding data 410, the control flow can pass from the extension module 404 to the parity module 406. The control flow can pass in a manner similar to the manner described above between the targeting module 402 and the extension module 404, but using the processing results of the extension module 404, such as the target appended block 418, the prime shift factor 416, or a combination thereof.

The parity module 406 is configured to encode the information. The parity module 406 can process the prepared information. The parity module 406 can generate a target parity component 424 based on processing the target appended block 418. The parity module 406 can generate the target parity component 424 as ECC information, including parity or recovery information, corresponding to the target encoding data 410.

The parity module 406 can generate the target parity component 424 based on combining portions within the target appended block 418 for encoding the target encoding data 410. For example, the parity module 406 can generate the target parity component 424 according to:

$$Pj = \wedge_{i=0}^{N} Di^{ikj} = D0 \hat{\ } D1^{kj} \hat{\ } D2^{2kj} \hat{\ } \ldots \hat{\ } DN^{Nkj}, \quad \text{Equation (1)}.$$

The term 'Pj' can represent individual instances of the target parity component 424. The term 'j' can be an index or an identifier for the individual components and associated with the parity block quantity 214 of FIG. 2.

For Equation (1), the term 'Di' can represent individual components of the target appended block 418 with an index or an identifier of 'i' associated with the data block quantity 213 of FIG. 2. For example, 'Di' can represent individual data blocks, channels, data structures, banks, subunits or subgroupings, or a combination thereof within the target appended block 418. Further, the '$Di^{ikj}$' operation can represent a circular-shift operation or mechanism involving the target appended block 418 and any adjustments or spacing parameters represented as '$k_j$'. Details regarding the circular-shift operation or mechanism are discussed below.

The parity module 406 can combine using a variety of operations, such as mathematical or logical operations. For example, the parity module 406 can combine using summation, multiplication, power operator, 'OR', 'AND', or a combination thereof. As a more specific example, Equation (1) is described as utilizing a bit-wise 'XOR', as exemplified by the operator '^'.

The parity module 406 can generate the target parity component 424 based on an adjustment set 434, represented in Equation (1) as '$k_j$'. The adjustment set 434 is a processing parameter for providing separation and diversity across instances of the target parity component 424. The adjustment set 434 can include a value, a method or an equation for calculating the value, or a combination thereof. The adjustment set 434 can provide redundancy based on a pattern of differences across instances of the target parity component 424 corresponding to the target encoding data 410. The adjustment set 434 can be predetermined by the computing system 100.

The parity module 406 can generate the target parity component 424 of various dimension, size, or complexity. For example, the parity module 406 can generate the target parity component 424 as a set with two or more parity components therein, greater than 1 parity component utilized in common RAID systems.

Continuing with the illustrative example above, the parity module 406 can generate the target parity component 424 including a first parity component 426, a second parity component 428, a third parity component 430, a fourth parity component 432, or a combination thereof. The computing system 100 can utilize or implement the parity block quantity 214 of any real number, such as two, three, four, or greater. The parity components can correspond to the parity block quantity 214.

Continuing with the illustrative example above, the set of the parity components up to four can be illustrated as:

$$P0 = \wedge_{i=0}^{N} Di^{0} = D0 \hat{\ } D1 \hat{\ } D2 \hat{\ } \ldots \hat{\ } DN, \quad \text{Equation (2)};$$

$$P1 = \wedge_{i=0}^{N} Di^{i} = D0 \hat{\ } D1^{1} \hat{\ } D2^{2} \hat{\ } \ldots \hat{\ } DN^{N}, \quad \text{Equation (3)};$$

$$P2 = \wedge_{i=0}^{N} Di^{2i} = D0 \hat{\ } D1^{2} \hat{\ } D2^{4} \hat{\ } \ldots \hat{\ } DN^{2N}, \quad \text{Equation (4); and}$$

$$P3 = \wedge_{i=0}^{N} Di^{3i} = D0 \hat{\ } D1^{3} \hat{\ } D2^{6} \hat{\ } \ldots \hat{\ } DN^{3N}, \quad \text{Equation (5)}.$$

The first parity component 426 can be represented as 'P0', the second parity component 428 can be represented as 'P1', the third parity component 430 can be represented as 'P2', and the fourth parity component 432 can be represented as 'P3'.

Continuing with the illustrative example above, the adjustment set 434 can further include components corresponding to the set of the parity components, the parity block quantity 214, or a combination thereof. For representing the set of the parity components up to four, the adjustment set 434 can include a first adjustment 436, a second adjustment 438, a third adjustment 440, a fourth adjustment 442, or a combination thereof. The exemplified equations can be based on a special case of the adjustment set 434, where:

$$k_j = j, \text{ for } j = 0, 1, 2, 3;\qquad\text{Equation (6).}$$

The first adjustment 436 '$k_1$' can be 0, the second adjustment 438 '$k_2$' can be 1, the third adjustment '$k_3$' can be 2, and the fourth adjustment 442 '$k_4$' can be 3 according to Equation (6).

It has been discovered that the target parity component 424 based on the target appended block 418 corresponding to the prime shift factor 416 provides lowered error rates. The target parity component 424 generated based on the prime shift factor 416 provides increased robustness and integrity of data based on higher likelihood of recovery.

The parity module 406 can generate the target parity component 424 using the storage engine 124, the processor unit 108, the controller unit 112, the data storage system 104, or a combination thereof. The parity module 406 can provide access to the target parity component 424, access the adjustment set 434 or the target appended block 418, or a combination thereof using the storage engine 124, the port 144, the interface 114, or a combination thereof.

After preparing the target encoding data 410, the control flow can pass from the parity module 406 to the storing module 408. The control flow can pass in a manner similar to the manner described above between the targeting module 402 and the extension module 404, but using the processing results of the parity module 406, such as one or more instances of the target parity component 424, the prime shift factor 416, or a combination thereof.

The storing module 408 is configured to store the target encoding data 410 along with the one or more instances of the target parity component 424. The storing module 408 can store the target encoding data 410, the target appended block 418, or a combination thereof along with the target parity component 424, such as the first parity component 426, the second parity component 428, the third parity component 430, the fourth parity component 432, or a combination thereof, for the storage data 212 of FIG. 2, the check data 216 of FIG. 2, or a combination thereof.

The storing module 408 can store the target encoding data 410, the target appended block 418, the target parity component 424, or a combination thereof in the processor unit 108, the memory unit 110, the controller unit 112, the data storage system 104, or a combination thereof. The storing module 408 can further store the target encoding data 410, the target parity component 424, or a combination thereof as the storage data 212, the check data 216, or a combination thereof in storage devices, such as the solid state disk 116, the non-volatile memory 118, the hard disk drive 134, the array 136, or a combination thereof.

Figure 5:
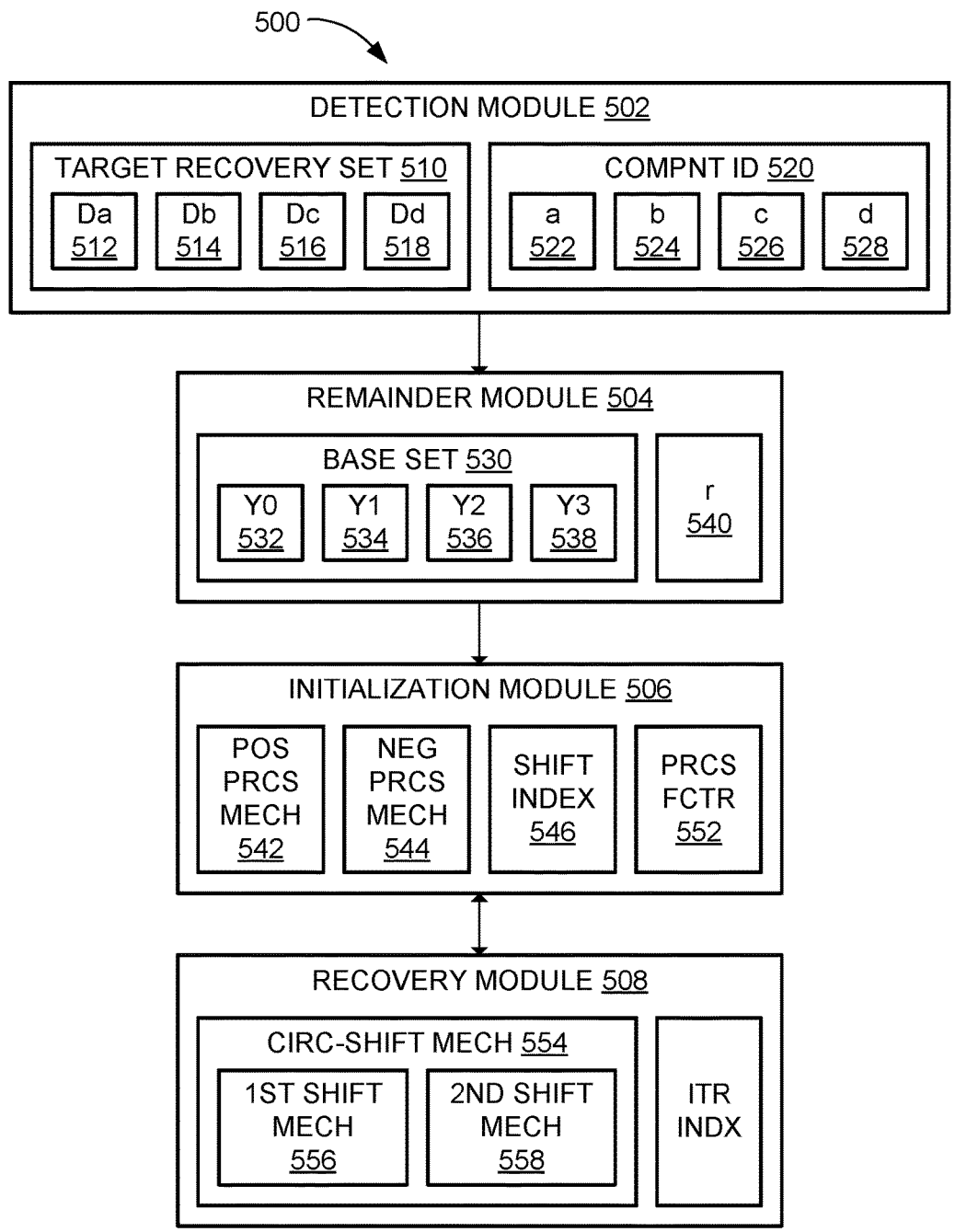
FIG. 5 is a detailed flow diagram of an exemplary recovery process for the circular-shift recovery mechanism in an embodiment of the invention.

Referring now to FIG. 5, therein is shown a detailed flow diagram of an exemplary recovery process 500 for the circular-shift recovery mechanism in an embodiment of the invention. The computing system 100 of FIG. 1 can utilize a detection module 502, a remainder module 504, an initialization module 506, a recovery module 508, or a combination thereof for the recovery process 500.

The detection module 502 can be coupled to the remainder module 504. The remainder module 504 can be coupled to the initialization module 506. The initialization module 506 can be coupled to the recovery module 508.

The detection module 502 is configured to detect issues with accessing information. The detection module 502 can detect issues, such as errors, data corruption, missing data, or a combination thereof, for the storage data 212 of FIG. 2, the check data 216 of FIG. 2, or a combination thereof. The detection module 502 can access the data stored in and provided by the processor unit 108 of FIG. 1, the memory unit 110 of FIG. 1, the controller unit 112 of FIG. 1, the data storage system 104 of FIG. 1, or a combination thereof, or stored in and provided by the storage devices, such as the solid state disk 116 of FIG. 1, the non-volatile memory 118 of FIG. 1, the hard disk drive 134 of FIG. 1, the array 136 of FIG. 1, or a combination thereof.

The detection module 502 can access and analyze the data including the target data block 230 of FIG. 2, the target parity block 232 of FIG. 2, the target appended block 418 of FIG. 4, or a combination thereof. The detection module 502 can access the data corresponding to the data block length 215 of FIG. 2, the prime shift factor 416 of FIG. 4, an offset, or a combination thereof.

The detection module 502 can detect the issues based on detecting one, two, or more of the erroneous data 224 of FIG. 2, detecting one, two, or more of the erroneous check data 216, or a combination thereof. The detection module 502 can detect the erroneous data 224, the erroneous check data 216, or a combination thereof representing the storage data 212, the check data 216, or a combination thereof inaccessible or failing a status check process after initial storage thereof.

For example, the detection module 502 can detect the erroneous data 224, the erroneous check data 216, or a combination thereof based on a status data returned from a circuit or a process associated with reading or locating the target data block 230, the target parity block 232, or a combination thereof. Also for example, the detection module 502 can detect the erroneous data 224, the erroneous check data 216, or a combination thereof based on a checksum value or an error detection process.

The detection module 502 can initiate recovery of the erroneous data 224, the erroneous check data 216, or a combination thereof. The detection module 502 can initiate by generating a target recovery set 510. The target recovery set 510 can represent an estimate of the originally stored data, without any errors, corresponding to the erroneous data 224, the erroneous check data 216, or a combination thereof.

The target recovery set 510 can include the data recovered from, replacing, or a combination thereof for the erroneous data 224, the erroneous check data 216, or a combination thereof. For illustrative example, the target recovery set 510 can include a first erased component 512 for recovering a single erased channel or component, a second erased component 514 for recovering a second erased channel or component, a third erased component 516 for recovering a third erased channel or component, a fourth erased component 518 for recovering a fourth erased channel or component, or a combination thereof. The first erased component 512 can be represented as 'Da', the second erased component 514 can be represented as 'Db', the third erased component 516 can be represented as 'Dc', and the fourth erased component 518 can be represented as 'Dd'.

The detection module 502 can further determine locations or identifiers associated with the erroneous data 224, the erroneous check data 216, or a combination thereof. The detection module 502 can determine one or more error component identification 520 corresponding to the erroneous data 224, the erroneous check data 216, or a combination thereof.

The error component identification 520 is an identifier or location information of the storage data 212, the check data 216, or a combination thereof having or corresponding to an access error. The error component identification 520 can identify or locate the erroneous data 224, the erroneous check data 216, or a combination thereof. The detection module 502 can determine the error component identification 520 as an address, a name, a starting point, or a combination thereof for the corresponding erroneous or inaccessible data.

Continuing with the illustrative example, the error component identification 520 can include a first component identification 522 for the first erased component 512, a second component identification 524 for the second erased component 514, a third component identification 526 for the third erased component 516, a fourth component identification 528 for the fourth erased component 518, or a combination thereof. The first component identification 522 can be represented as 'a', the second component identification 524 can be represented as 'b', the third component identification 526 can be represented as 'c', and the fourth component identification 528 can be represented as 'd.'

The detection module 502 can detect the issues, initiate recovery, determine location or identifier of the erroneous data, or a combination thereof using the storage engine 124 of FIG. 1, the processor unit 108, the controller unit 112, the data storage system 104, or a combination thereof. The detection module 502 can store the target recovery set 510, the error component identification 520, or a combination thereof in the processor unit 108, the memory unit 110, the controller unit 112, the data storage system 104, or a combination thereof. The detection module 502 can further store the target recovery set 510, the error component identification 520, or a combination thereof in storage devices, such as the solid state disk 116, the non-volatile memory 118, the hard disk drive 134, the array 136, or a combination thereof.

After detecting the issues, initiating recovery, determining location or identifier of the erroneous data, or a combination thereof, the control flow can pass from the detection module 502 to the remainder module 504. The control flow can pass in a manner similar to the manner described above between the targeting module 402 of FIG. 4 and the extension module 404 of FIG. 4, but using the processing results of the detection module 502, such as the target recovery set 510, the error component identification 520, or a combination thereof.

The remainder module 504 is configured to prepare the parameters necessary for the recovery process 500. For example, the remainder module 504 can determine the prime shift factor 416, analyze remaining data excluding the data errors, initially analyzing the data errors, or a combination thereof.

The remainder module 504 can determine the prime shift factor 416 similarly as discussed above. For example, the remainder module 504 can determine the prime shift factor 416 by selecting a prime number equal to or greater than the block unit-quantity 412 of FIG. 4. Also for example, the remainder module 504 can determine the prime shift factor 416 representing a smallest prime number not less than the block unit-quantity 412.

The remainder module 504 can analyze remaining data excluding the data errors by calculating a base set 530. The base set 530 is a grouping of analysis result corresponding to the target parity component 424 of FIG. 2 and the erroneous data 224, the erroneous check data 216, or a combination thereof configured to be used as an input or starting point for data recovering mechanism. The base set 530 can be represented as 'S'.

The remainder module 504 can calculate the base set 530 based on combining components or portions within the storage data 212, the check data 216, or a combination thereof excluding one or multiple of the erroneous data 224, the erroneous check data 216, or a combination thereof. Continuing with the illustrative example, above, the remainder module 504 can calculate the base set 530 including a first remaining result 532 and a second remaining result 534 for two errors, a third remaining result 536 corresponding to third error, a fourth remaining result 538 corresponding to fourth error, or a combination thereof.

Continuing with the illustrative example, above, the remainder module 504 can generate the first remaining result 532, the second remaining result 534, the third remaining result 536, the fourth remaining result 538, or a combination thereof based on combining the storage data 212, the check data 216, portions or blocks therein, or a combination thereof excluding one or more of the erroneous data 224, the erroneous check data 216, or a combination thereof. The remainder module 504 can generate the first remaining result 532, the second remaining result 534, the third remaining result 536, the fourth remaining result 538, or a combination thereof with the combining process utilizing the adjustment set 434 of FIG. 4.

As a more specific example, the remainder module 504 can generate one or more of the remaining results, as exemplified up to four of the parity block quantity 214 of FIG. 2, based on:

$$Y0 = \wedge_{i \neq a,b \ldots} Di^{k_0 i}, \quad \text{Equation (7);}$$

$$Y1 = \wedge_{i \neq a,b \ldots} Di^{k_1 i}, \quad \text{Equation (8);}$$

$$Y2 = \wedge_{i \neq a,b \ldots} Di^{k_2 i}, \quad \text{Equation (9); and}$$

$$Y3 = \wedge_{i \neq a,b \ldots} Di^{k_3 i}, \quad \text{Equation (10).}$$

The first remaining result 532 can be represented as 'Y0', the second remaining result 534 can be represented as 'Y1', the third remaining result 536 can be represented as 'Y2', and the fourth remaining result 538 can be represented as 'Y3'. As described by the equations above, the remaining results can be generated based on combining the remaining or satisfactory data blocks, excluding the components in the target recovery set 510 corresponding to the storage data 212, the check data 216, or a combination thereof, and separated and processed according to the adjustment set 434.

The remainder module 504 can calculate the base set 530 based on combining the remaining results, such as the first remaining result 532, the second remaining result 534, the third remaining result 536, the fourth remaining result 538, or a combination thereof. As a more specific example, for recovering the second erased component 514 of two erasures, represented as 'Db', the remainder module 504 can calculate the base set 530 based on:

$$S = Y0^{-bk_0} \char`\^ Y1^{-(k_1-k_0)a-bk_0} = Db \cdot Db^{(k_1-k_0)(b-a)}, \quad \text{Equation (11).}$$

Continuing with the illustrative example, Equation (11) can be simplified for special cases as:

$$S = Y0 \char`\^ Y1^{-a} = Db \cdot Db^{b-a}, \quad \text{Equation (12).}$$

For recovering the first erased component 512 of two erasures, the remainder module 504 can calculate the base set 530 based on swapping 'b' and 'a' for Equations (11)-(12).

The remainder module 504 can further calculate an erasure separation 540. The erasure separation 540 is a measure of difference between instances of the error component identification 520. The erasure separation 540 can represent a separation in the locations or identifiers of the components in the target recovery set 510 or the erroneous data 224, the erroneous check-data 228 of FIG. 2, or a combination thereof corresponding thereto.

The remainder module 504 can calculate the erasure separation 540 based on the one more erroneous data 224, the one more erroneous check data 216, or a combination thereof. For example, the remainder module 504 can calculate the erasure separation 540 based on calculating a difference between the error component identification 520 corresponding to the one more erroneous data 224, the one more erroneous check data 216, or a combination thereof.

Continuing with the illustrative example, for recovering the second erased component 514 of two erasures, represented as 'Db', the remainder module 504 can calculate the erasure separation 540 based on:

$$r=(k_1-k_0)(b-a), \quad \text{Equation (13).}$$

Continuing with the illustrative example, Equation (13) can be simplified for special cases as:

$$r=b-a, \quad \text{Equation (14).}$$

The remainder module 504 can prepare the parameters using the storage engine 124, the processor unit 108, the controller unit 112, the data storage system 104, or a combination thereof. The remainder module 504 can store the base set 530, the erasure separation 540, or a combination thereof in the processor unit 108, the memory unit 110, the controller unit 112, the data storage system 104, or a combination thereof. The remainder module 504 can further store the base set 530, the erasure separation 540, or a combination thereof in storage devices, such as the solid state disk 116, the non-volatile memory 118, the hard disk drive 134, the array 136, or a combination thereof.

After preparing the parameters, the control flow can pass from the remainder module 504 to the initialization module 506. The control flow can pass in a manner similar to the manner described above between the targeting module 402 and the extension module 404, but using the processing results of the remainder module 504, such as the base set 530, the erasure separation 540, or a combination thereof.

The initialization module 506 is configured to initialize values for recovering information. The initialization module 506 can initialize values for a positive-shift processing mechanism 542, a negative-shift processing mechanism 544, or a combination thereof. The positive-shift processing mechanism 542 is a method, a process, a circuit, a function, or a combination thereof utilizing regular incremental positive increases of one or more induces between processing iterations. The negative-shift processing mechanism 544 is a method, a process, a circuit, a function, or a combination thereof utilizing regular incremental negative decreases of one or more induces between processing iterations.

The positive-shift processing mechanism 542, the negative-shift processing mechanism 544, or a combination thereof can be for recovering the target recovery set 510. The positive-shift processing mechanism 542, the negative-shift processing mechanism 544, or a combination thereof can increment using circular shift with a barrel shift length, such as for the prime shift factor 416.

For example, the positive-shift processing mechanism 542 can increment up to an end according to the prime shift factor 416, and then reset to a beginning after the end. Also for example, the negative-shift processing mechanism 544 can increment down to the beginning, and then reset to the end according to the prime shift factor 416. Details regarding the positive-shift processing mechanism 542, the negative-shift processing mechanism 544, or a combination thereof are discussed further below.

The initialization module 506 can initialize a shifting index 546, a processing factor 552, or a combination thereof. The shifting index 546 is an indicator or an address for a location, a portion, a block, or a combination thereof within the storage data 212, the check data 216, or a combination thereof. The shifting index 546 can be incremented or shifted according to one or more mechanisms for recovering the data. The processing factor 552 can include an intermediate processing result. The processing factor 552 can provide results from previous iterations as input to a current processing iteration.

The initialization module 506 can initialize the shifting index 546, the processing factor 552, or a combination thereof can initialize the shifting index 546, the processing factor 552, or a combination thereof specific to the positive-shift processing mechanism 542, the negative-shift processing mechanism 544, or a combination thereof. For example, the initialization module 506 can initialize the shifting index 546 based on the erasure separation 540, the prime shift factor 416, circular shift, or a combination thereof.

As a more specific example, the initialization module 506 can initialize the shifting index 546 based on offsetting the erasure separation 540 by a predetermined constant and circularly shifting by the prime shift factor 416. The computing system 100 can shift the shifting index 546 by the erasure separation 540 for each iteration.

For further example, the initialization module 506 can initialize the shifting index 546 according to the positive-shift processing mechanism 542 based on:

$$idx=(r-1) \% L, \quad \text{Equation (15).}$$

Also for example, the initialization module 506 can initialize the shifting index 546 according to the negative-shift processing mechanism 544 based on:

$$idx=(-r-1) \% L, \quad \text{Equation (16).}$$

The shifting index 546 can be represented as 'idx'. The erasure separation 540 can be represented as 'r' and the prime shift factor 416 can be represented as 'L'. The circular shift operation, implemented as a remainder or modulo function, can be represented as '%'.

Also as a further example, the initialization module 506 can initialize the processing factor 552 according to the positive-shift processing mechanism 542, the negative-shift processing mechanism 544, or a combination thereof based on setting the value to zero. The processing factor 552 initialization can be represented as:

$$temp=0, \quad \text{Equation (17).}$$

The processing factor 552 can be represented as 'temp'.

Continuing with the illustrative example above, '% L=(x+nL) % L>0' for any 'n', and 'L' can be circular length of 1031 bytes. Since 'L' is a prime number, 'gcd(L,r)=1', hence by Bezout's Identity, there can exist integers 'x' and 'y' such that 'r·x+L·y=1'. It has been discovered that circular shift based on the prime shift factor 416 can guarantee recovery of the target recovery set 510 in their entirety.

The computing system 100 can implement the positive-shift processing mechanism 542, the negative-shift processing mechanism 544, or a combination thereof. For example, the computing system 100 can implement the positive-shift processing mechanism 542 simultaneously along with the negative-shift processing mechanism 544. The positive-shift processing mechanism 542 and the negative-shift processing mechanism 544 can each include its own instance of the shifting index 546 incrementing in a corresponding direction or manner.

The initialization module 506 can initialize using the storage engine 124, the processor unit 108, the controller unit 112, the data storage system 104, or a combination thereof. The initialization module 506 can store the initialized values, such as the shifting index 546, the processing factor 552, or a combination thereof in the processor unit 108, the memory unit 110, the controller unit 112, the data storage system 104, or a combination thereof. The initialization module 506 can further store initialized values, such as the shifting index 546, the processing factor 552, or a combination thereof in storage devices, such as the solid state disk 116, the non-volatile memory 118, the hard disk drive 134, the array 136, or a combination thereof.

After initialization, the control flow can pass from the initialization module 506 to the recovery module 508. The control flow can pass in a manner similar to the manner described above between the targeting module 402 and the extension module 404, but using the processing results of the initialization module 506, such as the shifting index 546, the processing factor 552, or a combination thereof.

The recovery module 508 is configured to recover the data. The recovery module 508 can recover the data based on generating and completing the target recovery set 510. The recovery module 508 can generate the target recovery set 510 in an iterative manner. The recovery module 508 can further generate based on a circular-shift mechanism 554.

The based on a circular-shift mechanism 554 is a process, a method, a pattern, an equation, or a combination thereof for controlling or implementing the circular shift for the shifting index 546. The circular-shift mechanism 554 can include a first shift mechanism 556, a second shift mechanism 558, or a combination thereof. The first shift mechanism 556 can be the circular-shift mechanism 554 incrementing in an increasing manner for the positive-shift processing mechanism 542. The second shift mechanism 558 can be the circular-shift mechanism 554 incrementing in an decreasing manner for the negative-shift processing mechanism 544.

The circular-shift mechanism 554 can be based on utilizing the prime shift factor 416, the erasure separation 540, the shifting index 546, or a combination thereof. For example, the circular-shift mechanism 554 can be based on implementing a circular shift, such as for modulo or remainder functions, based on or limited by the prime shift factor 416, and incremented by the erasure separation 540. As a more specific example, the first shift mechanism 556 can be represented as:

$$idx = (idx + r) \% L,\qquad \text{Equation (18)}.$$

Also for example, the second shift mechanism 558 can be represented as:

$$idx = (idx - r) \% L,\qquad \text{Equation (19)}.$$

The recovery module 508 can generate the target recovery set 510 in an iterative manner. The recovery module 508 can generate the target recovery set 510 iteratively recovering for each instance of the shift unit 414 of FIG. 4. The recovery module 508 can iteratively generate the target recovery set 510 based on the circular-shift mechanism 554 for recovering the erroneous data 224, the erroneous check data 216, or a combination thereof. The recovery module 508 can use the circular-shift mechanism 554 incrementing over or for each iteration. The recovery module 508 can use the circular-shift mechanism 554 to process different portions of the target recovery set 510 for each iteration.

The recovery module 508 can utilize an iteration index. The iteration index can be represented as 'i'. The iteration index can provide number of iterations based on the data block quantity 213 of FIG. 2, the prime shift factor 416, or a combination thereof. As a more specific example, the iteration index can range from '0' to 'L−1'.

The recovery module 508 can further generate the target recovery set 510 based on the base set 530, the erasure separation 540, the shifting index 546, the processing factor 552, the target recovery set 510, the circular-shift mechanism 554, the iteration index, or a combination thereof. The circular-shift mechanism 554 can be integral with the processing mechanism, such as the positive-shift processing mechanism 542, the negative-shift processing mechanism 544, or a combination thereof.

As a more specific example, the recovery module 508 can utilize the positive-shift processing mechanism 542 including or implementing the first shift mechanism 556 can be represented as:

TABLE (1)

Recover DU by DU:
FOR i = 0 to L − 1
    Db[idx] = S[(idx − r)%L]^temp;
    temp = Db[idx];
    idx = (idx + r)%L;
END Also as a more specific example, the recovery module 508 can utilize the negative-shift processing mechanism 544 including or implementing the second shift mechanism 558 can be represented as:

TABLE (2)

Recover DU by DU:
FOR i = 0 to L − 1
    Db[idx] = S[idx]^temp;
    temp = Db[idx];
    idx = (idx − r)%L;
END The above examples can be for recovering the second erased component 514, represented as 'Db'.

For each iteration of the iteration index 'i' for the processing mechanisms above, the recovery module 508 can recover a component, a portion, a segment, or a combination thereof of the target recovery set 510 or the component therein, exemplified for 'Db' above, corresponding to the shifting index 546 represented as 'idx'. The target recovery set 510 or the component therein can be generated based on the base set 530, represented as 'S', the processing factor 552, represented as 'temp', or a combination thereof.

For example, the target recovery set 510 or the component therein can be generated based on combining the base set 530, the processing factor 552, or a combination thereof, such as based mathematical or logical operations. As a more specific example, the target recovery set 510 or the component therein can be generated based on performing 'XOR' with the base set 530 and the processing factor 552. Also as a more specific example, the target recovery set 510 or the component therein can be generated using the base set 530 corresponding to the shifting index 546, the shifting index 546 offset by the erasure separation 540 and circularly shifted using the prime shift factor 416, or a combination thereof.

Continuing with the processing mechanism exemplified above, the processing factor 552 can be set to or adjusted to the currently resulting value of the target recovery set 510 or the component therein. The processing factor 552 can be utilized in subsequent iterations. Following the calculation or adjustment of the processing factor 552, the recovery module 508 can utilize the circular-shift mechanism 554 to increment the shifting index 546.

For example, the recovery module 508 can increment or adjust the shifting index 546 based on incrementing by the erasure separation 540 and circularly shifting, such as by wrapping around for the modulo function or the remainder function, based on the prime shift factor 416. As a more specific example, the recovery module 508 can generate the target recovery set 510 based on the positive-shift processing mechanism 542 including or implementing the first shift mechanism 556 utilizing the shifting index 546 positively incrementing by the erasure separation 540 and circularly shifting by the prime shift factor 416. Also as a more specific example, the recovery module 508 can generate the target recovery set 510 based on the negative-shift processing mechanism 544 including or implementing the second shift mechanism 558 utilizing the shifting index 546 negatively incrementing by the erasure separation 540 and circularly shifting by the prime shift factor 416.

The recovery module 508 can generate the target recovery set 510 based on using or implementing the positive-shift processing mechanism 542, the negative-shift processing mechanism 544, or a combination thereof. For example, the recovery module 508 can generate the target recovery set 510 based on using or implementing either the positive-shift processing mechanism 542 or the negative-shift processing mechanism 544.

Also for example, the recovery module 508 can generate the target recovery set 510 based on simultaneously using or implementing both the positive-shift processing mechanism 542 and the negative-shift processing mechanism 544. As a more specific example, the recovery module 508 can generate the target recovery set 510 based on the circular-shift mechanism 554 simultaneously implementing the first shift mechanism 556 and the second shift mechanism 558, wherein the first shift mechanism 556 and the second shift mechanism 558 increment in opposite directions. The recovery module 508 can utilize parallel structure, circuitry, function or routine, or a combination thereof to simultaneously implement both the first shift mechanism 556 and the second shift mechanism 558.

The above illustrations have been for recovering the second erased component 514 of two erasures. However, it is understood that the recovery module 508 can recover data in other scenarios. For example, the recovery module 508 can recover the first erased component 512 of two erasures, represented as 'Da', based on above equations and methods with the first component identification 522 changed with the second component identification 524 and the second similarly changed with the first.

As a more specific example, for recovering the first erased component 512 of two erasures, the recovery module 508 can calculate the base set 530 based on:

$$S = Y0^{-ak_0} \wedge Y1^{-(k_1-k_0)b-ak_0} = Da \cdot Da^{(k_1-k_0)(a-b)}, \quad \text{Equation (20)}.$$

The recovery module 508 can further calculate the erasure separation 540 based on:

$$r = (k_1 - k_0)(a-b). \quad \text{Equation (21)}.$$

The recovery module 508 can subsequently use the positive-shift processing mechanism 542, the negative-shift processing mechanism 544, or a combination thereof to generate the target recovery set 510 or the first erased component 512 therein. As a further example, the recovery module 508 can utilize the mechanism exemplified in Table (1), Table (2), or both.

Also as an illustrative example of recovering data in other scenarios, the recovery module 508 can calculate the base set 530 for recovering three erasures based on same or similar scheme as described above. The recovery module 508 can recover the third erased component 516, one or more of the target parity component 424, or a combination thereof. The recovery module 508 can implement the recovery process utilizing the first parity component 426 of FIG. 4, the second parity component 428 of FIG. 4, the third parity component 430 of FIG. 4, or a combination thereof.

Continuing with the illustrative example, the recovery module 508 can recover two erased data blocks, such as for the first erased component 512 and the second erased component 514, represented as 'Da' and 'Db', based on:

$$Y0 = \wedge_{i \neq a,b} Di^0,$$

$$Y1 = \wedge_{i \neq a,b} Di^i, \text{ and}$$

$$Y2 = \wedge_{i \neq a,b} Di^{2i}, \quad \text{Equation (22)}.$$

The recovery module 508 can generate the first remaining result 532, the second remaining result 534, the third remaining result 536, or a combination thereof for the base set 530 based on Equation (22).

Continuing with the illustrative example, if the third parity component 430 'P2' is erased, the above exemplified process for recovering two components can be utilized as described above. Also, if the second parity component 428 'P1' is erased, the recovery module 508 can calculate or generate the base set 530 based on:

$$S = Y0 \wedge Y2^{-2a} = Db \cdot Db^{2b-2a}, \quad \text{Equation (23)}.$$

The recovery module 508 can further calculate a corresponding instance of the erasure separation 540 based on:

$$t = 2b - 2a, \quad \text{Equation (24)}.$$

The corresponding instance of the erasure separation 540 can be represented as 't'. The recovery module 508 can subsequently utilize the positive-shift processing mechanism 542, the negative-shift processing mechanism 544, or a combination thereof, such as exemplified in Table (1), Table (2), or a combination thereof.

Continuing with the illustrative example, if the first parity component 426 'P0' is erased, the recovery module 508 can calculate or generate the base set 530 based on:

$$S = Y1^{-b} \wedge Y2^{-a-b} = Db \cdot Db^{b-a}, \quad \text{Equation (25)}.$$

The recovery module 508 can further calculate a corresponding instance of the erasure separation 540 based on:

$$t = b - a, \quad \text{Equation (26)}.$$

The recovery module 508 can subsequently utilize the positive-shift processing mechanism 542, the negative-shift processing mechanism 544, or a combination thereof as described and exemplified above.

Continuing with the illustrative example, the recovery module 508 can recover three erased data blocks, such as for the first erased component 512, the second erased component 514, and the third erased component 516, represented as 'Da', 'Db', and 'Dc', based on generating the remaining results according to:

$$Y0 = \wedge_{i \neq a,b,c} Di^0,$$

$$Y1 = \wedge_{i \neq a,b,c} Di^i, \text{ and}$$

$$Y2 = \wedge_{i \neq a,b,c} Di^{2i}, \quad \text{Equation (27).}$$

Further, the base set 530 for recovering the third erased component 516 can be based on:

$$S' = Y0 \char`\^ Y1^{-a} \char`\^ Y1^{-b} \char`\^ Y2^{-a-b} = (Dc \char`\^ Dc^t) \char`\^ (Dc \char`\^ Dc^t)^u = (Dc \char`\^ Dc^u) \char`\^ (Dc \char`\^ Dc^u)^t, \quad \text{Equation (28).}$$

The recovery module 508 can further calculate corresponding instances of the erasure separation 540 based on:

$$t = c - a \text{ and } u = c - b, \quad \text{Equation (29).}$$

Continuing with the illustrative example of three erased blocks, there can be integers 'x' and 'y' that satisfy one of the equations in the following set:

$$x \cdot t = y \cdot L + u,$$

$$x \cdot t = y \cdot L - u,$$

$$x \cdot u = y \cdot L + t, \text{ and}$$

$$x \cdot u = y \cdot L - t, \quad \text{Equation (30).}$$

Based on the prime shift factor 416 being a prime number, there can be integers 'x' and 'y' that satisfy one of the equations above. When there are 'N' data blocks, the relationship '$1 \leq |t|, |u| \leq N-1$' can be utilized. The term 'm' be the smallest, such as in terms of magnitude, x that satisfies one of the equations in the above set.

Continuing with the illustrative example of three erased blocks, if test condition satisfies '$m \cdot t = y \cdot L + u$', the recovery module 508 can calculate or generate the base set 530 based on:

$$S = S'\char`\^ S^{u}\char`\^ \ldots \char`\^ S^{(m-1)t} = Dc \char`\^ Dc^{2u}, \quad \text{Equation (31).}$$

The recovery module 508 can further calculate corresponding instance of the erasure separation 540 based on:

$$r = 2u, \quad \text{Equation (32).}$$

If the test condition satisfies '$m \cdot t = y \cdot L - u$', the recovery module 508 can calculate or generate the base set 530 based on:

$$S = (S'\char`\^ S^{u}\char`\^ \ldots \char`\^ S^{(m-1)t})^u = Dc \char`\^ Dc^{2u}, \quad \text{Equation (33).}$$

The recovery module 508 can further calculate corresponding instance of the erasure separation 540 based on Equation (32).

Continuing with the illustrative example of three erased blocks, if test condition satisfies '$m \cdot u = y \cdot L + t$', the recovery module 508 can calculate or generate the base set 530 based on:

$$S = S'\char`\^ S^{u}\char`\^ \ldots \char`\^ S^{(m-1)u} = Dc \char`\^ Dc^{2t}, \quad \text{Equation (34).}$$

The recovery module 508 can further calculate corresponding instance of the erasure separation 540 based on:

$$r = 2t, \quad \text{Equation (35).}$$

If the test condition satisfies '$m \cdot u = y \cdot L - t$', the recovery module 508 can calculate or generate the base set 530 based on:

$$S = (S'\char`\^ S^{u}\char`\^ \ldots \char`\^ S^{(m-1)u})^t = Dc \char`\^ Dc^{2t}, \quad \text{Equation (37).}$$

The recovery module 508 can further calculate corresponding instance of the erasure separation 540 based on Equation (35).

Continuing with the illustrative example of three erased blocks, the recovery module 508 can recover the third erased component 516 based on implementing or utilizing the positive-shift processing mechanism 542, the negative-shift processing mechanism 544, or a combination thereof using the base set 530 and the erasure separation 540 corresponding to the test condition. The recovery module 508 can recover the first erased component 512, the second erased component 514, or a combination thereof in similar or same way independently.

The computing system 100 can precompute the values for each pair of 't' and 'u' for hardware implementation since 'N' is relatively small. For software implementation, the values can further be calculated dynamically.

Also for generating the base set 530, it has been discovered that the computing system 100 can implement other efficiencies. For example, the computing system 100 can utilize one or more shift registers with taps with equal spacing 't'. It has been discovered that such shift register provides efficiency and simplicity based on eliminating barrel shifts and eliminating any extra memory for computation.

Also for example, instead of performing '$m-1$' times of barrel shifts and performing 'XOR' function, the computing system can perform only $\log(m)$ times. As a more specific example, if $m=17$, let $S'_1 = S'\char`\^ S'^t$, $S'_2 = S'_1 \char`\^ S'_1{}^{2t}$, $S'_3 = S'_2 \char`\^ S'_2{}^{4t}$, $S'_4 = S'_3 \char`\^ S'_3{}^{8t}$, then $S = S'_4 \char`\^ S'^{16t} = (Dc \char`\^ Dc^u) \char`\^ (Dc \char`\^ Dc^u)^{17t} = Dc \char`\^ Dc^{2u}$ which requires only 5 times of barrel shifts and XOR.

Continuing with the illustrative example of three erased blocks, it has been discovered that recovery of data can be further simplified for a special case of three continuous erased channels, such as where '$b = a+1$' and '$c = b+1$'. To recover the first erased component 512 'Da' for the special case, the recovery module 508 can generate the base set 530 according to:

$$S' = Y0 \char`\^ Y1^{-c} \char`\^ Y1^{-b} \char`\^ Y2^{-c-b} = (Da \char`\^ Da^{-2}) \char`\^ (Da \char`\^ Da^{-2})^{-1}, \quad \text{Equation (38).}$$

Equation (38) can be further simplified for the special case to:

$$S = S'\char`\^ S^{r-1} = Da \char`\^ Da^{-4}. \quad \text{Equation (39).}$$

The erasure separation 540 can be set to '$-4$'.

Continuing with the illustrative example of three erased blocks, to recover the second erased component 514 'Db' for the special case, the recovery module 508 can generate the base set 530 according to:

$$S' = Y0 \char`\^ Y1^{-a} \char`\^ Y1^{-c} \char`\^ Y2^{-c-a} = (Db \char`\^ Db^{-1}) \char`\^ (Db \char`\^ Db^{-1})^1, \quad \text{Equation (40).}$$

Equation (40) can be further simplified for the special case to:

$$S = S'^1 = Db \char`\^ Db^2, \quad \text{Equation (41).}$$

The erasure separation 540 can be set to '2'.

Continuing with the illustrative example of three erased blocks, to recover the third erased component 516 'Dc' for the special case, the recovery module 508 can generate the base set 530 according to:

$$S' = Y0 \char`\^ Y1^{-a} \char`\^ Y1^{-b} \char`\^ Y2^{-b-a} = (Dc \char`\^ Dc^{-2}) \char`\^ (Dc \char`\^ Dc^{-2})^1, \quad \text{Equation (42).}$$

Equation (42) can be further simplified for the special case to:

$$S = S'\hat{}S'^1 = Dc\hat{}Dc^d,\qquad \text{Equation (41)}.$$

The erasure separation 540 can be set to '4'.

Generally for recovering three erased blocks, the recovery module 508 can recover three erased data blocks based on generating the three remaining results according to:

$$Y0 = \bigwedge_{i \neq a,b,c} Di^{k_0 i},$$

$$Y1 = \bigwedge_{i \neq a,b,c} Di^{k_1 i}, \text{ and}$$

$$Y2 = \bigwedge_{i \neq a,b,c} Di^{k_2 i},\qquad \text{Equation (42)}.$$

If '$2k_1 = k_0 + k_2$', the base set 530 can be according to:

$$S' = Y0^{-k_0 c\hat{}} Y1^{-k_0 c - (k_1 - k_0) a\hat{}} Y1^{-k_0 c - (k_1 - k_0) b\hat{}} Y1^{-k_0 c - (k_1 - k_0) b - (k_2 - k_1) a}$$
$$= Dc\hat{} Dc^{(k_1 - k_0)(c - a)\hat{}} Dc^{(k_1 - k_0)(c - b)\hat{}} Dc^{(k_2 - k_0) c - (k_1 - k_0) b - (k_2 - k_1) a}$$
$$= Dc\hat{} Dc^{(k_1 - k_0)(c - a)\hat{}} Dc^{(k_1 - k_0)(c - b)\hat{}} Dc^{(k_1 - k_0)(c - a) + (k_1 - k_0)(c - b)}$$
$$\text{Equation (43)}$$

Further, corresponding instances of the erasure separation 540 can be according to:

$$t = (k_1 - k_0)(c - a), \text{ and}$$

$$u = (k_1 - k_0)(c - b).\qquad \text{Equation (44)}.$$

Continuing with the illustrative example, the recovery module 508 can recover three erased data blocks, such as for the first erased component 512, the second erased component 514, the third erased component 516, and the fourth erased component 518, represented as 'Da', 'Db', 'Dc', and 'Dd', based on generating the remaining results according to:

$$Y0 = \bigwedge_{i \neq a,b,c} Di^{k_0 i},$$

$$Y1 = \bigwedge_{i \neq a,b,c} Di^{k_1 i},$$

$$Y2 = \bigwedge_{i \neq a,b,c} Di^{k_2 i}, \text{ and}$$

$$Y3 = \bigwedge_{i \neq a,b,c} Di^{k_3 i}.\qquad \text{Equation (45)}.$$

The recovery module 508 can recover the fourth erased component 518 based on Equation (45). The first erased component 512, the second erased component 514, and the third erased component 516 can be recovered in a similar or same way independently.

Continuing with the illustrative example of recovering four erasures, the recovery module 508 can utilize a relationship associated with the base set 530 represented as:

$$Y0^{-k_0 d\hat{}} Y1^{-k_0 d - (k_1 - k_0) a\hat{}} Y1^{-k_0 d - (k_1 - k_0) b\hat{}}$$
$$Y1^{-k_0 d - (k_1 - k_0) b\hat{}} Y2^{-k_0 d - (k_1 - k_0) c - (k_2 - k_1) b\hat{}}$$
$$Y2^{-k_0 d - (k_1 - k_0) b - (k_2 - k_1) a\hat{}} Y2^{-k_0 d - (k_1 - k_0) c - (k_2 - k_1) a\hat{}}$$
$$Y3^{-k_0 d - (k_3 - k_2) a - (k_2 - k_1) b - (k_1 - k_0) c\hat{}} = Dd\hat{}$$
$$Dd^{(k_1 - k_0)(d - a)\hat{}} Dd^{(k_1 - k_0)(d - b)\hat{}} Dd^{(k_1 - k_0)(d - c)\hat{}}$$
$$Dd^{(k_2 - k_0) d - (k_1 - k_0) c - (k_2 - k_1) b\hat{}}$$
$$Dd^{(k_2 - k_0) d - (k_1 - k_0) b - (k_2 - k_1) a\hat{}}$$
$$Dd^{(k_2 - k_0) d - (k_1 - k_0) c - (k_2 - k_1) a\hat{}}$$
$$Dd^{(k_3 - k_0) d - (k_1 - k_0) c - (k_2 - k_1) b - (k_3 - k_2) a} \qquad \text{Equation (46)}.$$

Equation (46) can further be simplified if the adjustment set 434 have adjustments that are continuous, such as when '$k_3 - k_2 = k_2 - k_1 = k_1 - k_0 = 1$'. Equation (46) can be simplified as:

$$Y0^{-k_0 d\hat{}} Y1^{-k_0 d - a\hat{}} Y1^{-k_0 d - b\hat{}} Y1^{-k_0 d - b\hat{}} Y2^{-k_0 d - c - b\hat{}}$$
$$Y2^{-k_0 d - b - a\hat{}} Y2^{-k_0 d - c - a\hat{}} Y3^{-k_0 d - a - b - c} = Dd\hat{}$$
$$Dd^{(d - a)\hat{}} Dd^{(d - b)\hat{}} Dd^{(d - c)\hat{}} Dd^{2d - c - b\hat{}}$$
$$Dd^{2d - b - a\hat{}} Dd^{2d - c - a\hat{}} Dd^{3d - c - b - a} \qquad \text{Equation (47)}.$$

Continuing with the illustrative example of recovering four erasures, for a special case where '$k_0 = 0$, $k_1 = 1$, $k_2 = 2$, and $k_3 = 3$', the recovery module 508 can generate the base set 530 according to:

$$S' = Y0\hat{} Y1^{-a\hat{}} Y1^{-b\hat{}} Y1^{-b\hat{}} Y2^{-c - b\hat{}} Y2^{-b - a\hat{}} Y2^{-c - a\hat{}}$$
$$Y3^{-a - b - c}, \qquad \text{Equation (48)}.$$

Similarly, the recovery module 508 can calculate corresponding instances of the erasure separation 540 based on:

$$t = d - c,\ u = d - b,\ v = d - a, \qquad \text{Equation (49)}.$$

Continuing with the illustrative example, the process for generating the base set 530 can be further generalized as:

$$S = S'''\hat{} S''^{2u\hat{}} \ldots \hat{} S'^{(m_2 u - 1) 2u} = S_t\hat{} S_t^t = Dd\hat{} Dd^{2t},\qquad \text{Equation (50)}.$$

The intermediate components '$S'''$', and '$S_t$' can be based on:

$$S' = Dd\hat{} Dd^t\hat{} Dd^u\hat{} Dd^v\hat{} Dd^{t + u}\hat{} Dd^{t + v}\hat{} Dd^{u + v}\hat{} Dd^{t + u + v} =$$
$$((Dd\hat{} Dd^t)\hat{} (Dd\hat{} Dd^t)^u)\hat{} ((Dd\hat{} Dd^t)\hat{} (Dd\hat{} Dd^t)^u)^v \qquad \text{Equation (51)},$$

$$S_t = Dd\hat{} Dd^t, \text{ and}$$

$$S_u = (Dd\hat{} Dd^t)\hat{} (Dd\hat{} Dd^t)^u = S_t\hat{} S_t\hat{} S_t^u,\qquad \text{Equation (52)},$$

$$S' = S_u\hat{} S_u^{v} = S_u\hat{} S_u^{v} = (S_t\hat{} S_t^{u})\hat{} (S_t\hat{} S_t^{u})^v, \qquad \text{Equation (53), and}$$

$$S''' = S'\hat{} S'^{v\hat{}} \ldots \hat{} S'^{(m_v - 1) v} = S_t\hat{} S_t^{2u}, \qquad \text{Equation (54)}.$$

The recovery module 508 can subsequently utilize the positive-shift processing mechanism 542, the negative-shift processing mechanism 544, or a combination thereof, such as exemplified in Table (1), Table (2), or a combination thereof.

As a further detailed example, the computing system 100 can process a special case where each channel contains four consecutive data blocks. If there is one channel erasure, all four consecutive data blocks can be lost. The special case can be characterized as '$d - c = c - b = b - a = 1$' for the corresponding instances of the erasure separation 540, and '$K_0 = 0$, $k_1 = 1$, $k_2 = 2$, and $k_3 = 3$' for the adjustment set 434 corresponding thereto. The length of 'Di' can be 1031 instances of the shift unit 414, or 1031 bytes.

For recovering the first erased component 512, the recovery module 508 can process the first intermediate value as:

$$S' = Y0\hat{} Y1^{-d\hat{}} Y1^{-c\hat{}} Y1^{-b\hat{}} Y2^{-c - b\hat{}} Y2^{-b - d\hat{}} Y2^{-c - d\hat{}}$$
$$Y3^{-d - b - c}, \text{ and}$$

$$t = a - b = -1,\ u = a - c = -2,\ v = a - d = -3. \qquad \text{Equation (55)}.$$

Equation (55) can be based on:

$$S' = ((Da\hat{} Da^v)\hat{} (Da\hat{} Da^v)^u)\hat{} ((Da\hat{} Da^v)\hat{} (Da\hat{} Da^v)^u)^t =$$
$$((Da\hat{} Da^{-3})\hat{} (Da\hat{} Da^{-3})^{-2})\hat{} ((Da\hat{} Da^{-3})\hat{}$$
$$(Da\hat{} Da^{-3})^{-2})^{-1} \qquad \text{Equation (56)}.$$

The second intermediate value can be based on:

$$S'' = S'\hat{} S'^{-1} = (Da\hat{} Da^{-3})\hat{} (Da\hat{} Da^{-3})^{-4}, \qquad \text{Equation (57)}.$$

The recovery module 508 can calculate 'm' value that satisfies Equation (30) based on '$t = -3$, $u = -4$, and $L = 1031$' as 257. The recovery module 508 can use the value to generate the base set 530 according to:

$$S = (S''\hat{} S''^{u\hat{}} \ldots \hat{} S''^{(m - 1) u})^t = (S''\hat{} S''^{-4\hat{}} \ldots \hat{}$$
$$S''^{-4 \cdot 256})^{-3} = Da\hat{} Da^{-6}, \qquad \text{Equation (58)}.$$

The corresponding erasure separation 540 can be $r = -6$. The recovery module 508 can subsequently utilize the positive-shift processing mechanism 542, the negative-shift processing mechanism 544, or a combination thereof, such as exemplified in Table (1), Table (2), or a combination thereof to recover the first erased component 512.

For processing the base set 530, the recovery module 508 can utilize either of the processes exemplified above. One way would be to use a shift register with 257 taps for XOR without barrel shift. The second method would be implemented as:

$$S_0 = S'''\hat{\,}S''^{-4};\ S_1 = S_0\hat{\,}S_0^{-8};\ S_2 = S_1\hat{\,}S_1^{-16};\ S_3 = S_2\hat{\,}S_2^{-32};$$
$$S_4 = S_3\hat{\,}S_3^{-64};\ S_5 = S_4\hat{\,}S_4^{-128};\ S_6 = S_5\hat{\,}S_5^{-256};$$
$$S_7 = S_6\hat{\,}S_6^{-512};\ \text{and}\ S = (S''\hat{\,}S_7^{-4})^{-3}, \quad \text{Equation (59)}.$$

For recovering the second erased component 514, the recovery module 508 can process the first intermediate value as:

$$S' = Y0\hat{\,}Y1^{-d}\hat{\,}Y1^{-c}\hat{\,}Y1^{-a}\hat{\,}Y2^{-c-a}\hat{\,}Y2^{-a-d}\hat{\,}Y2^{-c-d}\hat{\,}Y3^{-d-a-c},\ \text{and}$$

$$t = b-a = 1,\ u = b-c = -1,\ v = b-d = -2. \quad \text{Equation (60)}.$$

Equation (60) can be based on:

$$S' = Db\hat{\,}Db^t\hat{\,}Db^u\hat{\,}Db^v\hat{\,}Db^{t+u}\hat{\,}Db^{t+v}\hat{\,}Db^{u+v}\hat{\,}Db^{t+u+v} = Db^1\hat{\,}Db^{-3}, \quad \text{Equation (61)}.$$

The recovery module 508 can generate the base set 530 according to 'S=S'<sup>-1</sup>' and the erasure separation 540 according to 'r=−4'. The recovery module 508 can subsequently utilize the positive-shift processing mechanism 542, the negative-shift processing mechanism 544, or a combination thereof, such as exemplified in Table (1), Table (2), or a combination thereof to recover the first erased component 512.

For recovering the third erased component 516, the recovery module 508 can process the first intermediate value as:

$$S' = Y0\hat{\,}Y1^{-d}\hat{\,}Y1^{-b}\hat{\,}Y1^{-a}\hat{\,}Y2^{-a-b}\hat{\,}Y2^{-b-d}\hat{\,}Y2^{-a-d}\hat{\,}Y3^{-d-b-a},\ \text{and}$$

$$t = c-a = 2,\ u = c-b = 1,\ v = a-d = -1. \quad \text{Equation (62)}.$$

Equation (62) can be based on:

$$S' = Dc\hat{\,}Dc^t\hat{\,}Dc^u\hat{\,}Dc^v\hat{\,}Dc^{t+u}\hat{\,}Dc^{t+v}\hat{\,}Dc^{u+v}\hat{\,}Dc^{t+u+v} = Dc^{-1}\hat{\,}Dc^3, \quad \text{Equation (63)}.$$

The recovery module 508 can generate the base set 530 according to 'S=S'<sup>1</sup>' and the erasure separation 540 according to 'r=4'. The recovery module 508 can subsequently utilize the positive-shift processing mechanism 542, the negative-shift processing mechanism 544, or a combination thereof, such as exemplified in Table (1), Table (2), or a combination thereof to recover the first erased component 512.

For recovering the fourth erased component 518, the recovery module 508 can process the first intermediate value as:

$$S' = Y0\hat{\,}Y1^{-a}\hat{\,}Y1^{-b}\hat{\,}Y1^{-b}\hat{\,}Y2^{-c-b}\hat{\,}Y2^{-b-a}\hat{\,}Y2^{-c-a}\hat{\,}Y3^{-a-b-c},\ \text{and}$$

$$t = d-c = 1,\ u = d-b = 2,\ v = d-a = 3. \quad \text{Equation (64)}.$$

The second intermediate value can be based on:

$$S'' = S''\hat{\,}S'_1 = (Dd\hat{\,}Dd^3)\hat{\,}(Dd\hat{\,}Dd^3)^4, \quad \text{Equation (65)}.$$

The base set 530 can be based on:

$$S = (S'''\hat{\,}S''^{m\hat{\,}}\ \ldots\ \hat{\,}S''^{(m-1)u})^t = (S'''\hat{\,}S''^{4\hat{\,}}\ \ldots\ \hat{\,}S''^{4\cdot 256})^3 = Dd\hat{\,}Dd^6, \quad \text{Equation (66)}.$$

The corresponding erasure separation 540 can be 'r=6'. The recovery module 508 can subsequently utilize the positive-shift processing mechanism 542, the negative-shift processing mechanism 544, or a combination thereof, such as exemplified in Table (1), Table (2), or a combination thereof to recover the first erased component 512.

For processing the base set 530, the recovery module 508 can utilize either of the processes exemplified above. One way would be to use a shift register with 257 taps for XOR without barrel shift. The second method would be implemented as:

$$S_0 = S'''\hat{\,}S''^{4};\ S_1 = S_0\hat{\,}S_0^{8};\ S_2 = S_1\hat{\,}S_1^{16};\ S_3 = S_2\hat{\,}S_2^{32};$$
$$S_4 = S_3\hat{\,}S_3^{64};\ S_5 = S_4\hat{\,}S_4^{128};\ S_6 = S_5\hat{\,}S_5^{256};$$
$$S_7 = S_6\hat{\,}S_6^{512};\ \text{and}\ S = (S'''\hat{\,}S_7^{4})^{-3}, \quad \text{Equation (67)}.$$

For illustrative purposes, recovery of up to four erasures is described, although it is understood that any number of erasures can be recovered. The computing system 100 can extend recovery to any dimension using the examples and patterns discussed above.

It has been discovered that the recovery process 500 utilizing the circular-shift based on the prime shift factor 416 in with the processing mechanisms discussed above provide increased robustness for stored data and reduced error rates. The computing system 100 can utilize the positive-shift processing mechanism 542, the negative-shift processing mechanism 544, or a combination thereof implementing the circular-shift mechanism 554 to provide improved redundancy and increased effectiveness for recovering data.

It has further been discovered that the positive-shift processing mechanism 542 positively incrementing the shifting index 546 simultaneously and parallel with the negative-shift processing mechanism 544 negatively incrementing a further index provides increased efficiency in recovering the data. The two processing mechanisms can be implemented simultaneously in parallel, effectively reducing the processing time for the blocks by half or more.

It has further been discovered that solutions or processes for the special cases discussed above provide even further increase in efficiency. The special cases discussed above represent common error modes. The computing system 100 with the simplified process for the common error modes can reduce the processing resources often used in recovering for the common error modes.

The modules described in this application can be hardware implementation or hardware accelerators, including passive circuitry, active circuitry, or both, in one or more of the components, systems, units, devices, or a combination thereof exemplified in FIG. 1. The computing system 100 has further been described with module functions or order as an example.

The computing system 100 can further partition the modules differently or order the modules differently. For example, the targeting module 402 and the extension module 404 can be combined or the parity module 406 of FIG. 4 and the storing module 408 of FIG. 4 can be combined. Also for example, the remainder module 504, the initialization module 506, the recovery module 508, or a combination thereof can be combined. Also for example, the positive-shift processing mechanism 542 and the negative-shift processing mechanism 544 can be separated into two different parallel modules.

For illustrative purposes, the various modules have been described as being specific to the data storage system 104. However, it is understood that the modules can be distributed differently. For example, the various modules can be implemented in a different device, or the functionalities of the modules can be distributed across multiple devices. Also as an example, the various modules can be stored in a non-transitory memory medium As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit or circuit, such as a chip or a processor, or across multiple hardware units or circuits.

The modules described in this application can be stored in the non-transitory computer readable medium. The data storage system 104, the memory unit 110, the SSD 116, the NVM 118, the HDD 134, the array 136, the network attached device 154, or a combination thereof can represent the non-transitory computer readable medium. The data storage system 104, the memory unit 110, the SSD 116, the NVM 118, the HDD 134, the array 136, the network attached device 154, a portion therein, or a combination thereof can be removable from corresponding device or system. Examples of the non-transitory computer readable medium can be a non-volatile memory card or stick, an external hard disk drive, a tape cassette, or an optical disk.

Hardware including circuitry, transistors, processor, cross-point switch, integrated circuit cores, sequential logic, shift-registers, or combination thereof, can be configured to implement the recovery process 500, the encoding process 400 of FIG. 4, or a combination thereof, including operations such as circular-shift, multiplication, "exclusive or" (XOR), or combination thereof, can be implemented with hardware including circuitry, transistors, processor, computer, integrated circuit, integrated circuit cores, sequential logic, shift-registers, or combination thereof.

Figure 6:
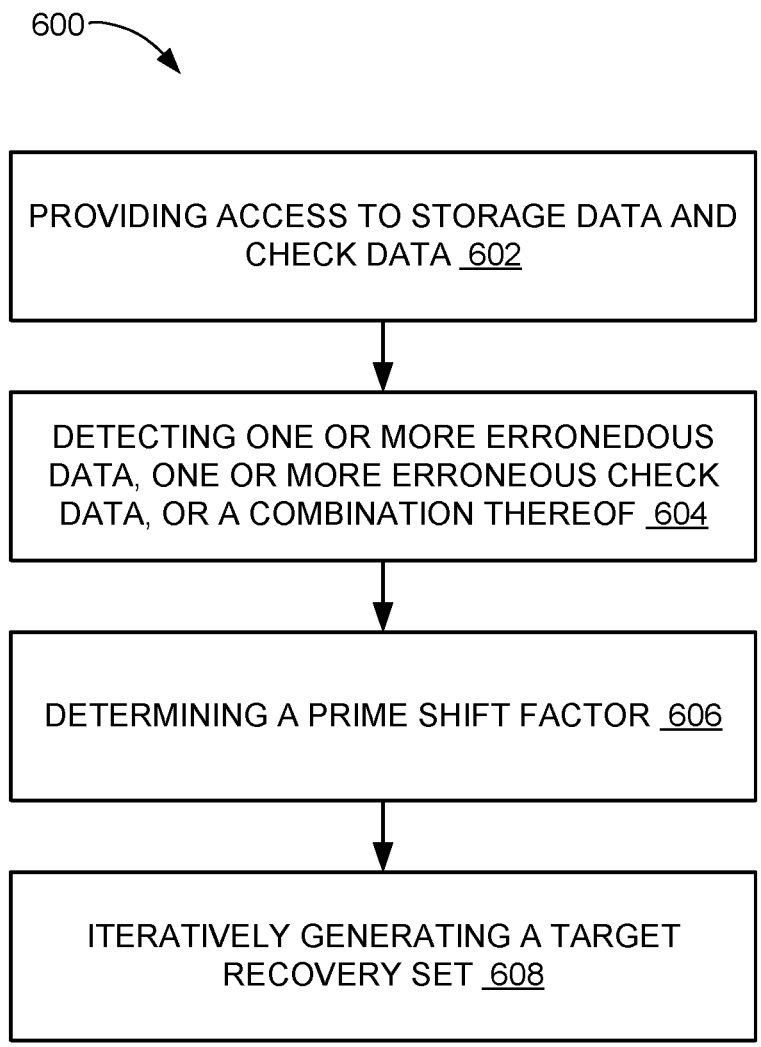
FIG. 6 is a flow chart of a method of operation of a computing system in an embodiment of the present invention.

Referring now to FIG. 6, therein is shown a flow chart of a method 600 of operation of the computing system 100 in a further embodiment of the present invention. The method 600 includes: providing access to storage data and check data corresponding to a data block length in a block 602; detecting one more erroneous data, one more erroneous check data, or a combination thereof for representing the storage data, the check data, or a combination thereof inaccessible or failing a status check process after initial storage thereof in a block 604; determining a prime shift factor for representing a smallest prime number not less than a block unit-quantity, wherein the block unit-quantity is for representing a quantity of shift units within the data block length in a block 606; and iteratively generating, with a storage engine, a target recovery set based on a circular-shift mechanism utilizing the prime shift factor for recovering the one more erroneous data, the one more erroneous check data, or a combination thereof in a block 608.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
   an array of storage devices configured to provide access to storage data and check data corresponding to a data block length; and
   a storage engine, coupled to the array of storage devices, configured to:
      detect one more erroneous data, one more erroneous check data, or a combination thereof for representing the storage data, the check data, or a combination thereof inaccessible or failing a status check process after initial storage thereof,
      determine a prime shift factor for representing a smallest prime number not less than a block unit-quantity, wherein the block unit-quantity is for representing a quantity of shift units within the data block length, and
      iteratively generate a target recovery set based on a circular-shift mechanism utilizing the prime shift factor for recovering originally stored data from the one more erroneous data, the one more erroneous check data, or a combination thereof.

2. The system as claimed in claim 1 wherein the storage engine is configured to:
   determine a target encoding data;
   generate a target appended block with an extended block length based on the prime shift factor with the extended block length greater than the data block length;
   generate a target parity component based on the target appended block, the target parity component corresponding to the target encoding data; and
   wherein:
      the array of storage devices is configured to store the storage data and the check data based on storing the target encoding data and the target parity component.

3. The system as claimed in claim 1 wherein the storage engine is configured to:
   calculate an erasure separation based on the one more erroneous data, the one more erroneous check data, or a combination thereof; and
   generate the target recovery set based on the circular-shift mechanism utilizing a shifting index positively incrementing by the erasure separation and circularly shifting by the prime shift factor.

4. The system as claimed in claim 1 wherein the storage engine is configured to:
   calculate an erasure separation based on the one more erroneous data, the one more erroneous check data, or a combination thereof; and
   generate the target recovery set based on the circular-shift mechanism utilizing a shifting index negatively incrementing by the erasure separation and circularly shifting by the prime shift factor.

5. The system as claimed in claim 1 wherein the storage engine is configured to:
   calculate an erasure separation based on the one more erroneous data, the one more erroneous check data, or a combination thereof; and
   initialize a shifting index based on offsetting the erasure separation by a predetermined constant and circularly shifting by the prime shift factor.

6. The system as claimed in claim 1 wherein the storage engine is configured to:
   detect two or more of the erroneous data, the erroneous check data, or a combination thereof;

calculate an erasure separation based on two or more of the erroneous data, the erroneous check data, or a combination thereof; and calculate a base set based on combining the storage data, the check data, or a combination thereof excluding the two or more of the erroneous data, the erroneous check data, or a combination thereof; and iteratively generate the target recovery set based on the erasure separation and the base set along with the circular-shift mechanism.

7. The system as claimed in claim 6 wherein the storage engine is configured to:

determine a target encoding data;

generate a target appended block based on appending an added data to the target encoding data, with the added data having a length corresponding to a multiple of the shift units;

generate a target parity component based on combining portions within the target appended block for encoding the target encoding data; and wherein:

the array of storage devices is configured to store the storage data and the check data based on storing the target encoding data and the target parity component.

8. The system as claimed in claim 1 wherein the storage engine is configured to generate the target recovery set based on the circular-shift mechanism simultaneously implementing a first shift mechanism and a second shift mechanism, wherein the first shift mechanism and the second shift mechanism increment in opposite directions.

9. The system as claimed in claim 1 wherein the storage engine is configured to:

determine error component identifications for identifying or locating the two or more of the erroneous data, the erroneous check data, or a combination thereof; and calculate the erasure separation based on a difference between the error component identifications.

10. The system as claimed in claim 1 wherein the storage engine is configured to:

generate a first remaining result based on combining the storage data, the check data, or a combination thereof excluding the two or more of the erroneous data, the erroneous check data, or a combination thereof with the combining process utilizing a first adjustment;

generate a second remaining result based on combining the storage data, the check data, or a combination thereof excluding the two or more of the erroneous data, the erroneous check data, or a combination thereof with the combining process utilizing a second adjustment different from the first adjustment; and calculate the base set based on combining the first remaining result and the second remaining result.

11. A method of operation of a computing system comprising:

providing access to storage data and check data corresponding to a data block length;

detecting one more erroneous data, one more erroneous check data, or a combination thereof for representing the storage data, the check data, or a combination thereof inaccessible or failing a status check process after initial storage thereof;

determining a prime shift factor for representing a smallest prime number not less than a block unit-quantity, wherein the block unit-quantity is for representing a quantity of shift units within the data block length; and iteratively generating, with a storage engine, a target recovery set based on a circular-shift mechanism utilizing the prime shift factor for recovering originally stored data from the one more erroneous data, the one more erroneous check data, or a combination thereof.

12. The method as claimed in claim 11 further comprising:

determining a target encoding data;

generating a target appended block with an extended block length based on the prime shift factor with the extended block length greater than the data block length;

generating a target parity component based on the target appended block, the target parity component corresponding to the target encoding data; and storing the storage data and the check data based on storing the target encoding data and the target parity component.

13. The method as claimed in claim 11 further comprising:

calculating an erasure separation based on the one more erroneous data, the one more erroneous check data, or a combination thereof; and wherein:

generating the target recovery set includes generating the target recovery set based on the circular-shift mechanism utilizing a shifting index positively incrementing by the erasure separation and circularly shifting by the prime shift factor.

14. The method as claimed in claim 11 further comprising:

calculating an erasure separation based on the one more erroneous data, the one more erroneous check data, or a combination thereof; and wherein:

generating the target recovery set includes generating the target recovery set based on the circular-shift mechanism utilizing a shifting index negatively incrementing by the erasure separation and circularly shifting by the prime shift factor.

15. The method as claimed in claim 11 further comprising:

calculating an erasure separation based on the one more erroneous data, the one more erroneous check data, or a combination thereof; and wherein:

generating the target recovery set includes initializing a shifting index based on offsetting the erasure separation by a predetermined constant and circularly shifting by the prime shift factor.

16. A non-transitory computer readable medium including instructions for execution, the instructions comprising:

providing access to storage data and check data corresponding to a data block length;

detecting one more erroneous data, one more erroneous check data, or a combination thereof for representing the storage data, the check data, or a combination thereof inaccessible or failing a status check process after initial storage thereof;

determining a prime shift factor for representing a smallest prime number not less than a block unit-quantity, wherein the block unit-quantity is for representing a quantity of shift units within the data block length; and iteratively generating a target recovery set based on a circular-shift mechanism utilizing the prime shift factor for recovering the one more erroneous data, the one more erroneous check data, or a combination thereof.

17. The medium as claimed in claim 16 with instructions further comprising:
   determining a target encoding data;
   generating a target appended block with an extended block length based on the prime shift factor with the extended block length greater than the data block length;
   generating a target parity component based on the target appended block, the target parity component corresponding to the target encoding data; and
   storing the storage data and the check data based on storing the target encoding data and the target parity component.

18. The medium as claimed in claim 16 with instructions further comprising:
   calculating an erasure separation based on the one more erroneous data, the one more erroneous check data, or a combination thereof; and
   wherein:
   generating the target recovery set includes generating the target recovery set based on the circular-shift mechanism utilizing a shifting index positively incrementing by the erasure separation and circularly shifting by the prime shift factor.

19. The medium as claimed in claim 16 with instructions further comprising:
   calculating an erasure separation based on the one more erroneous data, the one more erroneous check data, or a combination thereof; and
   wherein:
   generating the target recovery set includes generating the target recovery set based on the circular-shift mechanism utilizing a shifting index negatively incrementing by the erasure separation and circularly shifting by the prime shift factor.

20. The medium as claimed in claim 16 with instructions further comprising:
   calculating an erasure separation based on the one more erroneous data, the one more erroneous check data, or a combination thereof; and
   wherein:
   generating the target recovery set includes initializing a shifting index based on offsetting the erasure separation by a predetermined constant and circularly shifting by the prime shift factor.

* * * * *